United States Patent
Hatano et al.

(10) Patent No.: US 10,386,679 B2
(45) Date of Patent: Aug. 20, 2019

(54) MULTILAYER FILM AND METHOD FOR MANUFACTURING SAME, METHOD FOR MANUFACTURING OPTICALLY ANISOTROPIC TRANSFER BODY, OPTICALLY ANISOTROPIC LAYER, OPTICALLY ANISOTROPIC MEMBER, AND OPTICAL LAYERED BODY

(71) Applicant: ZEON CORPORATION, Chiyoda-ku, Tokyo (JP)

(72) Inventors: Taku Hatano, Tokyo (JP); Masakazu Saito, Tokyo (JP); Hiromasa Hashimoto, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 15/566,862

(22) PCT Filed: Apr. 20, 2016

(86) PCT No.: PCT/JP2016/062512
§ 371 (c)(1),
(2) Date: Oct. 16, 2017

(87) PCT Pub. No.: WO2016/171169
PCT Pub. Date: Oct. 27, 2016

(65) Prior Publication Data
US 2018/0101069 A1 Apr. 12, 2018

(30) Foreign Application Priority Data
Apr. 21, 2015 (JP) .................... 2015-086964

(51) Int. Cl.
| | | |
|---|---|---|
| G02F 1/13363 | (2006.01) | |
| H01L 51/50 | (2006.01) | |
| G02F 1/1335 | (2006.01) | |
| G02B 5/30 | (2006.01) | |
| H01L 51/52 | (2006.01) | |

(52) U.S. Cl.
CPC ..... G02F 1/133634 (2013.01); G02B 5/3016 (2013.01); G02F 1/13363 (2013.01); G02F 1/133528 (2013.01); H01L 51/50 (2013.01); G02F 2001/133633 (2013.01); G02F 2001/133638 (2013.01); G02F 2413/08 (2013.01); G02F 2413/13 (2013.01); G02F 2413/14 (2013.01); H01L 51/5293 (2013.01); Y10T 428/10 (2015.01); Y10T 428/1036 (2015.01)

(58) Field of Classification Search
CPC ......... G02F 1/133634; G02F 1/133528; G02F 1/13363; G02F 1/133633; G02F 2413/08; G02F 2413/13; G02F 2413/14; B32B 7/02; B32B 7/005; G02B 5/30; G02B 5/3016; Y10T 428/10; Y10T 428/1036; Y10T 428/1086

USPC ....... 428/1.1, 1.3, 1.6, 517; 349/117, 88, 94, 349/95
See application file for complete search history.

(56) References Cited

U.S. PATENT DOCUMENTS

| | | |
|---|---|---|
| 5,030,322 A | 7/1991 | Shimada et al. |
| 5,132,147 A | 7/1992 | Takiguchi et al. |
| 5,833,880 A | 11/1998 | Siemensmeyer et al. |
| 6,215,539 B1 | 4/2001 | Schadt et al. |
| 6,300,991 B1 | 10/2001 | Schadt et al. |
| 6,699,405 B2 | 3/2004 | Prechtl et al. |
| 6,793,986 B2 | 9/2004 | Prechtl et al. |
| 7,754,912 B2 | 7/2010 | Irisawa et al. |
| 7,760,275 B2 | 7/2010 | Fujii |
| 7,771,616 B2 | 8/2010 | Irisawa et al. |
| 9,034,151 B2 | 5/2015 | Doi et al. |
| 2004/0189909 A1 | 9/2004 | Kashima |
| 2007/0292680 A1 | 12/2007 | Nakayama et al. |
| 2008/0180619 A1 | 7/2008 | Kashima |
| 2015/0167150 A1 | 6/2015 | Doi et al. |

FOREIGN PATENT DOCUMENTS

| | | |
|---|---|---|
| JP | S5666826 A | 6/1981 |
| JP | H039325 A | 1/1991 |
| JP | H0383017 A | 4/1991 |
| JP | H0416919 A | 1/1992 |
| JP | H0733885 A | 2/1995 |
| JP | H0850206 A | 2/1996 |
| JP | H08160430 A | 6/1996 |
| JP | H08313912 A | 11/1996 |
| JP | H11153712 A | 6/1999 |
| JP | 2980558 B2 | 11/1999 |
| JP | H11513360 A | 11/1999 |
| JP | 2000267105 A | 9/2000 |

(Continued)

OTHER PUBLICATIONS

Nobukawa et al "Birefringence and strain-induced crystallization of stretched cellulose acetate propionate films", Jan. 16, 2017, V111, p. 53-60. (Year: 2017).*
Oct. 24, 2017, International Preliminary Report on Patentability issued in the International Patent Application No. PCT/JP2016/062512.
C. Destrade et al., "Disc-Like Mesogens: A Classification", Molecular Crystals and Liquid Crystals, 1981, pp. 111-135, vol. 71.
J. Zhang et al., "Liquid Crystals Based on Shape-Persistent Macrocyclic Mesogens", J. Am. Chem. Soc., 1994, p. 2655, vol. 116.
Jul. 19, 2016, International Search Report issued in the International Patent Application No. PCT/JP2016/062512.

(Continued)

*Primary Examiner* — Ruiyun Zhang
(74) *Attorney, Agent, or Firm* — Kenja IP Law PC

(57) ABSTRACT

A multilayer film including a first substrate and an optically anisotropic layer that is formed directly on the first substrate and contains cured liquid crystal molecules, wherein the first substrate has an orientation regulating force, and the first substrate has a tensile elastic modulus at 23° C. of 2,500 MPa or more.

17 Claims, No Drawings

(56) References Cited

FOREIGN PATENT DOCUMENTS

| | | | |
|---|---|---|---|
| JP | 2000298210 | A | 10/2000 |
| JP | 2002006322 | A | 1/2002 |
| JP | 2002030042 | A | 1/2002 |
| JP | 2002328371 | A | 11/2002 |
| JP | 2003177242 | A | 6/2003 |
| JP | 2003207641 | A | 7/2003 |
| JP | 2004204190 | A | 7/2004 |
| JP | 2004226757 | A | 8/2004 |
| JP | 2005263789 | A | 9/2005 |
| JP | 2006047724 | A | 2/2006 |
| JP | 3823962 | B2 | 9/2006 |
| JP | 2007017890 | A | 1/2007 |
| JP | 2007119415 | A | 5/2007 |
| JP | 2007186430 | A | 7/2007 |
| JP | 2008020895 | A | 1/2008 |
| JP | 2011118137 | A | 6/2011 |
| JP | 4775968 | B2 | 9/2011 |

OTHER PUBLICATIONS

The Chemical Society of Japan, "Chemistry of Liquid Crystal", Quarterly Chemical Review, 1994, No. 22, Chapter 5 and Section 2 of Chapter 10.

* cited by examiner

MULTILAYER FILM AND METHOD FOR MANUFACTURING SAME, METHOD FOR MANUFACTURING OPTICALLY ANISOTROPIC TRANSFER BODY, OPTICALLY ANISOTROPIC LAYER, OPTICALLY ANISOTROPIC MEMBER, AND OPTICAL LAYERED BODY

FIELD

The present invention relates to a multilayer film having an optically anisotropic layer and a method for producing the same; a method for producing an optically anisotropic transfer body using the multilayer film; an optically anisotropic layer obtained from the optically anisotropic transfer body; an optically anisotropic member and an optical layered body that each have the optically anisotropic layer; and a method for producing the optically anisotropic member using the optical layered body.

BACKGROUND

A phase difference plate is widely used as a component of a display device such as a liquid crystal display device and an organic electroluminescent display device. Hereinafter, organic electroluminescence may be referred to as "organic EL". A phase difference plate used in the display device may be required to uniformly express a desired retardation of ¼ wavelength, ½ wavelength, or the like in the entire wavelength region for displaying (usually visible region), thereby exerting the effect in the entire wavelength region for displaying.

As one of methods for producing such a phase difference plate, there is known a method of molding a compound capable of exhibiting a liquid crystal phase into a solid film while the liquid crystal phase is kept. Examples of the method may include a method in which a composition containing a polymerizable liquid crystal compound that is polymerizable and is capable of exhibiting a liquid crystal phase is applied onto a surface of an appropriate substrate to form a layer, and the polymerizable liquid crystal compound in the layer is oriented, and then polymerized while the oriented state is maintained, to form a film having an optical anisotropy. According to this method, a phase difference plate that uniformly expresses a retardation in the plane can be obtained. Further, when the polymerizable liquid crystal compound is appropriately selected, a phase difference plate that expresses a uniform retardation in a visible light wavelength region can be obtained with this method. As a method for orienting a compound capable of exhibiting a liquid crystal phase in this method, various methods have been investigated in prior art. For example, a method for orienting a liquid crystal compound using a film that has been subjected to stretcing treatment as a substrate has been known as those in Patent Literatures 1 to 3.

CITATION LIST

Patent Literature

Patent Literature 1: Japanese Patent Application Laid-Open No. Hei. 3-9325 A
Patent Literature 2: Japanese Patent Application Laid-Open No. Hei. 4-16919 A
Patent Literature 3: Japanese Patent Application Laid-Open No. 2003-207641 A

SUMMARY

Technical Problem

In the prior art method using the polymerizable liquid crystal compound, a wrinkle may occur on a surface of a film to be produced due to thermal expansion, thermal shrinkage, and the like that are caused by polymerization. Such a wrinkle is usually minute, but makes it difficult to obtain a film having favorable planarity and may cause disturbance of optical properties such as retardation. Therefore, it is desirable to suppress the wrinkle.

The present invention has been made in view of the aforementioned problems. An object of the present invention is to provide a multilayer film having an optically anisotropic layer on a surface of which a wrinkle is suppressed; a method for producing the multilayer film having an optically anisotropic layer on a surface of which a wrinkle is suppressed; a method for producing an optically anisotropic transfer body having an optically anisotropic layer on a surface of which a wrinkle is suppressed; an optically anisotropic layer on a surface of which a wrinkle is suppressed; an optically anisotropic member having the optically anisotropic layer on a surface of which a wrinkle is suppressed; an optical layered body having the optically anisotropic layer on a surface of which a wrinkle is suppressed; and a method for producing the optically anisotropic member using the optical layered body.

Solution to Problem

The present inventor has intensively studied to solve the aforementioned problems. As a result, the inventor has found that when an optically anisotropic layer is provided directly on a substrate having a certain tensile elastic modulus and also having orientation regulating force, formation of a wrinkle on a surface of the optically anisotropic layer can be suppressed. The present invention has thus been completed.

That is, the present invention is as follows.

(1) A multilayer film comprising a first substrate and an optically anisotropic layer that is formed directly on the first substrate and contains cured liquid crystal molecules, wherein
the first substrate has an orientation regulating force, and
the first substrate has a tensile elastic modulus at 23° C. of 2,500 MPa or more.

(2) The multilayer film according to (1), wherein the orientation regulating force of the first substrate is generated by stretching.

(3) The multilayer film according to (1) or (2), wherein
the first substrate has a slow axis, and
the optically anisotropic layer has a slow axis approximately parallel to a direction of the slow axis of the first substrate.

(4) The multilayer film according to any one of (1) to (3), wherein the first substrate is formed of a resin having a positive intrinsic birefringence.

(5) The multilayer film according to any one of (1) to (4), wherein the first substrate has a birefringence Δn of 0.0010 or more.

(6) The multilayer film according to any one of (1) to (5), wherein the first substrate is formed of a resin containing a crystallizable alicyclic structure-containing polymer.

(7) The multilayer film according to (6), wherein the alicyclic structure-containing polymer is a hydrogenated product of a ring-opening polymer of dicyclopentadiene.

(8) The multilayer film according to any one of (1) to (7), wherein the optically anisotropic layer has a thickness of 5 µm or less.

(9) A method for producing an optically anisotropic transfer body comprising the steps of:

separating the optically anisotropic layer from the first substrate of the multilayer film according to any one of (1) to (8); and attaching the optically anisotropic layer to a second substrate.

(10) A method for producing the multilayer film according to any one of (1) to (8), comprising the steps of:

stretching a pre-stretch film formed of a resin containing a crystallizable polymer at a temperature that is equal to or higher than the glass transition temperature of the polymer Tg−30° C. and equal to or lower than Tg+60° C. to obtain a stretched film;

relaxing strain of the stretched film at a temperature that is equal to or higher than the glass transition temperature of the polymer and equal to or lower than the melting point of the polymer while maintaining the stretched film in a flat state, to obtain a first substrate;

applying a liquid crystal composition containing a polymerizable liquid crystal compound directly onto the first substrate, to form a layer of the liquid crystal composition;

orienting the polymerizable liquid crystal compound in the layer of the liquid crystal composition; and polymerizing the polymerizable liquid crystal compound to obtain an optically anisotropic layer.

(11) An optically anisotropic layer obtained by separating the second substrate from the optically anisotropic transfer body produced by the method for producing an optically anisotropic transfer body according to (9)

(12) An optically anisotropic member comprising the optically anisotropic layer according to (11) and a third substrate.

(13) The optically anisotropic member according to (12), wherein the third substrate is a linear polarizer.

(14) The optically anisotropic member according to (12), wherein the third substrate is an optical compensation layer.

(15) An optical layered body comprising the optically anisotropic transfer body produced by the method for producing an optically anisotropic transfer body according to (9) and a third substrate.

(16) The optical layered body according to (15), wherein the third substrate is a linear polarizer.

(17) The optical layered body according to (15), wherein the third substrate is an optical compensation layer.

(18) An optically anisotropic member obtained by separating the second substrate from the optical layered body according to any one of (15) to (17).

Advantageous Effects of Invention

According to the multilayer film of the present invention, formation of a wrinkle on a surface of an optically anisotropic layer can be suppressed.

According to the method for producing a multilayer film of the present invention, a multilayer film having an optically anisotropic layer in which formation of a wrinkle on a surface is suppressed can be produced.

According to the method for producing an optically anisotropic transfer body of the present invention, an optically anisotropic transfer body having an optically anisotropic layer in which formation of a wrinkle on a surface is suppressed can be produced.

According to the optically anisotropic layer of the present invention, formation of a wrinkle on a surface thereof can be suppressed.

According to the optically anisotropic member of the present invention, formation of a wrinkle on the surface of the optically anisotropic layer can be suppressed.

According to the optical layered body of the present invention, formation of a wrinkle on the surface of the optically anisotropic layer can be suppressed.

According to the method for producing an optically anisotropic member of the present invention, the optical anisotropic member can be produced using the optical layered body.

DESCRIPTION OF EMBODIMENTS

The present invention will be explained in detail hereinbelow referring to examples and embodiments. The present invention is not limited to the following examples and embodiments, and may be implemented with any modification without departing from the scope of claims and equivalents thereto.

In the following description, a "long-length" film means a film having a length at least five or more times, and preferably ten or more times the width, and specifically means a film having a length capable of being wound into a roll shape for storage or transportation.

In the following description, an "orientation angle" of the long-length film means an angle of a slow axis of the film relative to a widthwise direction of the film unless otherwise specified.

In the following description, a resin having a positive intrinsic birefringence means a resin of which a refractive index in a stretching direction is larger than a refractive index in a direction orthogonal to the stretching direction. A resin having a negative intrinsic birefringence means a resin of which the refractive index in the stretching direction is smaller than the refractive index in the direction orthogonal to the stretching direction. The intrinsic birefringence may be calculated from dielectric constant distribution.

In the following description, an in-plane retardation Re of a film is a value represented by Re=(nx−ny)×d and a retardation Rth in a thickness direction of the film is a value represented by Rth=[{(nx+ny)/2}−nz]×d unless otherwise specified. Herein, nx represents a refractive index in a direction that gives the maximum refractive index among directions perpendicular to the thickness direction (in-plane directions) of the film, ny represents a refractive index in a direction that is perpendicular to the direction of nx among the in-plane directions of the film, nz represents a refractive index in the thickness direction of the film, and d represents the thickness of the film.

In the following description, a direction of an element that is "parallel" and "perpendicular" may include an error within a range that does not impair the effects of the present invention, for example, within a range of ±5°, preferably ±3°, and more preferably ±1° unless otherwise specified.

In the following description, a plate-shaped member, such as a "polarizing plate", a "½ wavelength plate", a "¼ wavelength plate", and a "phase difference plate", is not limited to a rigid member, and may have a film shape and flexibility unless otherwise specified.

[1. Summary of Multilayer Film]

The multilayer film of the present inventor has a first substrate and an optically anisotropic layer that is formed directly on the first substrate and contains cured liquid crystal molecules. The first substrate is usually a film having a long-length shape or a sheet piece shape. The optically anisotropic layer is formed on the surface of this film. The "cured liquid crystal molecules" herein mean molecules of a compound in a solidified product that is obtained by solidification wherein the compound that is capable of exhibiting a liquid crystal phase is solidified while keeping the state of exhibiting the liquid crystal phase. Examples of the cured liquid crystal molecules may include a polymer obtained by polymerizing a polymerizable liquid crystal compound.

[2. Configuration of First Substrate]

The first substrate has an orientation regulating force. The orientation regulating force of the first substrate means properties of the first substrate that are capable of orienting a polymerizable liquid crystal compound in a liquid crystal composition applied onto the first substrate. Since the first substrate has the orientation regulating force, the optically anisotropic layer can be formed directly on the first substrate.

The orientation regulating force of the first substrate may be generated by any treatment. Examples of a treatment of imparting the orientation regulating force to the first substrate may include an optical orientation treatment (see Japanese Patent No. 2980558 B and Japanese Patent Application Laid-Open No. Hei. 11-153712 A), a rubbing treatment (see Japanese Patent Application Laid-Open No. Hei. 08-160430 A, Japanese Patent Application Laid-Open No. 2000-267105 A, Japanese Patent Application Laid-Open No. 2002-6322 A, Japanese Patent Application Laid-Open No. 2000-298210 A, and Japanese Patent Application Laid-Open No. 2002-328371 A), an ion beam-irradiation treatment (see Japanese Patent Application Laid-Open No. Hei. 3-83017 A, Japanese Patent Application Laid-Open No. Hei. 8-313912 A, Japanese Patent Application Laid-Open No. 2006-047724 A, Japanese Patent No. 3823962 B, and Japanese Patent No. 4775968 B), a vapor deposition film formation treatment (see Japanese Patent Application Laid-Open No. Sho. 56-66826 A, Japanese Patent Application Laid-Open No. Hei. 7-33885 A, and Japanese Patent Application Laid-Open No. 2007-017890 A), and a stretching treatment. Among these, a stretching treatment is preferable since occurrence of orientation defect due to attachment of foreign substance can be effectively suppressed and the orientation regulating force can be rapidly imparted to the first substrate. Therefore, it is preferable that the orientation regulating force of the first substrate is generated by stretching. Additionally, it is preferable that the first substrate is a stretched substrate.

The tensile elastic modulus at 23° C. of the first substrate is usually 2,500 MPa or more, preferably 2,700 MPa or more, and more preferably 3,000 MPa or more, and is preferably 5,000 MPa or less, more preferably 4,500 MPa or less, and particularly preferably 3,500 MPa or less. Since the first substrate has such a large tensile elastic modulus, formation of a wrinkle on the surface of the optically anisotropic layer formed on the first substrate can be suppressed.

The tensile elastic moduli of the first substrate in all in-plane directions thereof may be uniform, but may be uneven. Herein, the in-plane directions of the first substrate mean directions perpendicular to the thickness direction of the first substrate. When the tensile elastic moduli of the first substrate in the in-plane directions are uneven, it is preferable that the tensile elastic moduli in all directions of the first substrate fall within the aforementioned range. Usually, when the first substrate has a slow axis, in one of the slow axis direction of the first substrate and the in-plane direction perpendicular to the slow axis, the tensile elastic modulus of the first substrate is maximum, and in the other direction, the tensile elastic modulus of the first substrate is minimum. Thus, when the tensile elastic moduli of the first substrate fall within the aforementioned range in both the slow axis direction of the first substrate and the in-plane direction perpendicular to the slow axis, it is recognized that the tensile elastic moduli in all the directions of the first substrate fall within the aforementioned range.

The reason in which the formation of a wrinkle on the optically anisotropic layer can be suppressed by having such a large tensile elastic modulus of the first substrate is estimated as follows. However, the technical scope of the present invention is not limited by the following reason.

When a polymerizable liquid crystal compound contained in a layer of a liquid crystal composition formed on a substrate is oriented or polymerized, the substrate is usually heated. For example, when heat is applied for promoting orientation or for promoting thermal polymerization, the substrate is heated due to the heat. As another example, when irradiation with light is performed for promoting light polymerization, the light is absorbed by the substrate, and as a result, the substrate is heated. By such heating, a prior art substrate is subjected to size change due to thermal expansion or thermal shrinkage. This size change is a cause for formation of a wrinkle on the optically anisotropic layer. On the other hand, the first substrate has a large tensile elastic modulus. Therefore, even when a stress causing thermal shrinkage or thermal expansion by heating is generated in the first substrate, the size is not prone to be changed. Accordingly, the formation of a wrinkle on the surface of the optically anisotropic layer is suppressed.

The tensile elastic modulus of the first substrate may be measured by the following method.

In the first substrate, a measurement direction in which measurement of the tensile elastic modulus is attempted is set. The first substrate is cut out to obtain a test piece of a rectangular shape (10 mm in width×250 mm in length) having long sides that are parallel to the measurement direction of the first substrate. The stress at which the test piece is distorted by drawing in the long side direction is measured in accordance with JIS K7113 using a tensile tester under conditions of a temperature of 23° C., a humidity of 60±5% RH, a distance between chucks of 115 mm, and a tensile speed of 100 mm/min. The measurement is repeated three times. From the measurement data of the measured stress and distortion corresponding to the stress, measurement data in which the distortion of the test piece falls within a range of 0.6% to 1.2% for every 0.2% are selected. That is, the measurement data in which the distortion of the test piece is 0.6%, 0.8%, 1.0%, and 1.2% are selected. From the selected measurement data during three measurements, the tensile elastic modulus of the first substrate in the measurement direction is calculated using a least-squares method.

As the material for the first substrate, any material capable of imparting the orientation regulating force to a surface of the first substrate may be used. As the material for the first substrate, a resin is usually used. As the resin, a resin containing various types of polymers may be used. Examples of the polymer may include an alicyclic structure-containing polymer, a cellulose ester, polyethylene terephthalate, a polyvinyl alcohol, a polyimide, UV-transmitting acrylic, a polycarbonate, a polysulfone, a polyether sulfone, an epoxy polymer, a polystyrene, and a combination thereof.

Particularly, it is preferable that the resin as the material for the first substrate has a positive intrinsic birefringence. When a resin having a positive intrinsic birefringence is used as the material, a first substrate having favorable properties such as high orientation regulating force, high strength, and low cost can be easily obtained.

It is preferable that the material for the first substrate is a resin containing a crystallizable polymer. The crystallizable polymer means a polymer having a melting point. Specifically, the crystallizable polymer means a polymer of which the melting point can be measured by a differential scanning calorimeter (DSC). The resin containing the crystallizable polymer tends to have a large tensile elastic modulus. Therefore, when a first substrate formed of the resin containing the crystallizable polymer is used, formation of a wrinkle on the optically anisotropic layer can be effectively suppressed. In the following description, the resin containing the crystallizable polymer may be appropriately referred to as "crystallizable resin"

Examples of the crystallizable polymer may include an alicyclic structure-containing crystallizable polymer and a polystyrene-based crystallizable polymer (see Japanese Patent Application Laid-Open No. 2011-118137 A). In particular, an alicyclic structure-containing crystallizable polymer is preferable since the polymer has excellent transparency, low hygroscopicity, size stability, and light weight.

The alicyclic structure-containing polymer is a polymer having an alicyclic structure in the molecule that is obtainable by a polymerization reaction using a cyclic olefin as a monomer, or a hydrogenated product thereof. Examples of an alicyclic structure of the alicyclic structure-containing polymer may include a cycloalkane structure and a cycloalkene structure. Among these, a cycloalkane structure is preferable since a first substrate having excellent properties such as thermal stability is easily obtained. The number of carbon atoms contained in one alicyclic structure is preferably 4 or more, and more preferably 5 or more, and is preferably 30 or less, more preferably 20 or less, and particularly preferably 15 or less. When the number of carbon atoms contained in one alicyclic structure falls within the aforementioned range, mechanical strength, heat resistance, and moldability are highly balanced.

In the alicyclic structure-containing polymer, the ratio of a structural unit having an alicyclic structure relative to all structural units is preferably 30% by weight or more, more preferably 50% by weight or more, and particularly preferably 70% by weight or more. When the ratio of the structural unit having an alicyclic structure in the alicyclic structure-containing polymer is made large as described above, heat resistance can be enhanced.

The rest in the alicyclic structure-containing polymer other than the structural unit having an alicyclic structure is not especially limited, and may be appropriately selected depending on the purposes of use.

The melting point Tm of the alicyclic structure-containing crystallizable polymer is preferably 200° C. or higher, and more preferably 230° C. or higher, and is preferably 290° C. or lower. When an alicyclic structure-containing polymer having such a melting point Tm is used, a first substrate having an excellent balance between moldability and heat resistance may be obtained.

The weight-average molecular weight (Mw) of the alicyclic structure-containing crystallizable polymer is preferably 1,000 or more, and more preferably 2,000 or more, and is preferably 1,000,000 or less, and more preferably 500,000 or less. An alicyclic structure-containing polymer having such a weight-average molecular weight has an excellent balance between molding processability and heat resistance.

The molecular weight distribution (Mw/Mn) of the alicyclic structure-containing crystallizable polymer is preferably 1.0 or more, and more preferably 1.5 or more, and is preferably 4.0 or less, and more preferably 3.5 or less. Herein, Mn represents a number-average molecular weight. An alicyclic structure-containing polymer having such a molecular weight distribution has excellent molding processability.

The weight-average molecular weight (Mw) and molecular weight distribution (Mw/Mn) of the alicyclic structure-containing polymer may be measured as a polystyrene equivalent value by gel permeation chromatography (GPC) using tetrahydrofuran as a developing solvent.

The glass transition temperature Tg of the alicyclic structure-containing crystallizable polymer is not particularly limited, and is usually 85° C. or higher and 170° C. or lower.

Examples of the alicyclic structure-containing polymer may include the following polymer ($\alpha$) to polymer ($\delta$). Among these, the polymer ($\beta$) is preferable as the alicyclic structure-containing crystallizable polymer since a first substrate having excellent heat resistance is easily obtained.

Polymer ($\alpha$): a ring-opening polymer of a cyclic olefin monomer, having crystallizability Polymer ($\beta$): a hydrogenated product of the polymer ($\alpha$), having crystallizability Polymer ($\gamma$): an addition polymer of a cyclic olefin monomer, having crystallizability Polymer ($\delta$): a hydrogenated product of the polymer ($\gamma$), having crystallizability Specifically, the alicyclic structure-containing polymer is more preferably a ring-opening polymer of dicyclopentadiene having crystallizability, or a hydrogenated product of the ring-opening polymer of dicyclopentadiene having crystallizability, and particularly preferably a hydrogenated product of the ring-opening polymer of dicyclopentadiene having crystallizability. Herein, the ring-opening polymer of dicyclopentadiene means a polymer in which the ratio of a structural unit derived from dicyclopentadiene relative to all structural units is usually 50% by weight or more, preferably 70% by weight or more, more preferably 90% by weight or more, and further preferably 100% by weight.

Hereinafter, methods for producing the polymers ($\alpha$) and ($\beta$) will be described.

The cyclic olefin monomer usable in production of the polymers ($\alpha$) and ($\beta$) is a compound having a ring structure formed of carbon atoms and having a carbon-carbon double bond in the ring. Examples of the cyclic olefin monomer may include a norbornene-based monomer. When the polymer ($\alpha$) is a copolymer, a monocyclic olefin may be used as the cyclic olefin monomer.

The norbornene-based monomer is a monomer containing a norbornene ring. Examples of the norbornene-based monomer may include a bicyclic monomer such as bicyclo[2.2.1]hept-2-ene (common name: norbornene) and 5-ethylidene-bicyclo[2.2.1]hept-2-ene (common name: ethylidene norbornene) and derivatives thereof (for example, those having a substituent in a ring); a tricyclic monomer such as tricyclo[4.3.0.1$^{2,5}$]deca-3,7-diene (common name: dicyclopentadiene) and derivatives thereof; and a tetracyclic monomer such as 7,8-benzotricyclo[4.3.0.1$^{2,5}$]dec-3-ene (common name: methanotetrahydrofluorene: also referred to as 1,4-methano-1,4,4a,9a-tetrahydrofluorene) and derivatives thereof, tetracyclo[4.4.0.1$^{2,5}$.1$^{7,10}$]dodec-3-ene (common name: tetracyclododecene), and 8-ethylidenetetracyclo[4.4.0.1$^{2,5}$.1$^{7,10}$]-3-dodecene and derivatives thereof.

Examples of a substituent in the aforementioned monomer may include an alkyl group such as a methyl group and an ethyl group; an alkenyl group such as a vinyl group; an alkylidene group such as a propan-2-ylidene group; an aryl group such as a phenyl group; a hydroxy group; an acid anhydride group; a carboxyl group; and an alkoxycarbonyl group such as a methoxycarbonyl group. The monomer may have solely one type of the substituent, and may also have two or more types thereof at any ratio.

Examples of the monocyclic olefin may include a cyclic monoolefin such as cyclobutene, cyclopentene, methylcyclopentene, cyclohexene, methylcyclohexene, cycloheptene, and cyclooctene; and a cyclic diolefin such as cyclohexadiene, methylcyclohexadiene, cyclooctadiene, methylcyclooctadiene, and phenylcyclooctadiene.

As the cyclic olefin monomer, one type thereof may be solely used, and two or more types thereof may also be used in combination at any ratio. When two or more types of the cyclic olefin monomer are used, the polymer ($\alpha$) may be a block copolymer or a random copolymer.

Some of the cyclic olefin monomers may allow existence of endo- and exo-stereoisomers. As the cyclic olefin monomer, any of the endo- and exo-stereoisomers may be used. Either one isomer of the endo- or exo-streoisomers may be solely used. Alternatively, an isomer mixture containing the endo- and exo-stereoisomers at any ratio may also be used. In particular, it is preferable that the ratio of either one of the isomers is higher since thereby crystallizability of the alicyclic structure-containing polymer is enhanced and a first substrate having excellent heat resistance can be easily obtained. For example, the ratio of the endo- or exo-stereoisomer is preferably 80% or more, more preferably 90% or more, and further preferably 95% or more. It is preferable that the endo-stereoisomer is at a higher ratio because it can be easily synthesized.

In synthesis of the polymer ($\alpha$), a ring-opening polymerization catalyst is usually used. As the ring-opening polymerization catalyst, one type thereof may be solely used, and two or more types thereof may also be used in combination at any ratio. As the ring-opening polymerization catalyst for synthesis of the polymer ($\alpha$), it is preferable to use a ring-opening polymerization catalyst that may achieve ring-opening polymerization of the cyclic olefin monomer to produce a ring-opening polymer having syndiotactic stereoregularity. Preferable examples of the ring-opening polymerization catalyst may include a ring-opening polymerization catalyst including a metal compound represented by the following formula (1):

$$M(NR^{1i})X^{i}_{4-a}(OR^{2i})_a \cdot L_b \qquad (1)$$

(wherein M is a metal atom selected from the group consisting of the Group 6 transition metal atoms in the periodic table, $R^{1i}$ is a phenyl group optionally having a substituent on one or more of the positions 3, 4, and 5, or a group represented by —$CH_2R^{3i}$ (wherein $R^{3i}$ is a group selected from the group consisting of a hydrogen atom, an alkyl group optionally having a substituent, and an aryl group optionally having a substituent), $R^{2i}$ is a group selected from the group consisting of an alkyl group optionally having a substituent and an aryl group optionally having a substituent, $X^i$ is a group selected from the group consisting of a halogen atom, an alkyl group optionally having a substituent, an aryl group optionally having a substituent, and an alkylsilyl group, L is a neutral electron donor ligand, a is a number of 0 or 1, and b is an integer of 0 to 2).

In the formula (1), M is a metal atom selected from the group consisting of the Group 6 transition metal atoms in the periodic table. M is preferably chromium, molybdenum, or tungsten, more preferably molybdenum or tungsten, and particularly preferably tungsten.

In the formula (1), $R^{1i}$ is a phenyl group optionally having a substituent on one or more of the positions 3, 4, and 5, or a group represented by —$CH_2R^{3i}$.

The number of carbon atoms of the phenyl group optionally having a substituent on one or more of the positions 3, 4, and 5 of $R^{1i}$ is preferably 6 to 20, and more preferably 6 to 15. Examples of the substituent may include an alkyl group such as a methyl group and an ethyl group; a halogen atom such as a fluorine atom, a chlorine atom, and a bromine atom; and an alkoxy group such as a methoxy group, an ethoxy group, and an isopropoxy group. The phenyl group may have solely one type of the substituent, and may also have two or more types thereof at any ratio. In $R^{1i}$, the substituents present on two or more of the positions 3, 4, and 5 may be bonded to each other to form a ring structure.

Examples of the phenyl group optionally having a substituent on one or more of the positions 3, 4, and 5 may include an unsubstituted phenyl group; a monosubstituted phenyl group such as a 4-methylphenyl group, a 4-chlorophenyl group, a 3-methoxyphenyl group, a 4-cyclohexylphenyl group, and a 4-methoxyphenyl group; a disubstituted phenyl group such as a 3,5-dimethylphenyl group, a 3,5-dichlorophenyl group, a 3,4-dimethylphenyl group, and a 3,5-dimethoxyphenyl group; a trisubstituted phenyl group such as a 3,4,5-trimethylphenyl group and a 3,4,5-trichlorophenyl group; and a 2-naphthyl group optionally having a substituent such as a 2-naphthyl group, a 3-methyl-2-naphthyl group and a 4-methyl-2-naphthyl group.

In the group represented by —$CH_2R^{3i}$ of $R^{1i}$, $R^{3i}$ is group selected from the group consisting of a hydrogen atom, an alkyl group optionally having a substituent, and an aryl group optionally having a substituent.

The number of carbon atoms in the alkyl group optionally having a substituent of $R^{3i}$ is preferably 1 to 20, and more preferably 1 to 10. This alkyl group may be either linear or branched. Examples of the substituent may include a phenyl group optionally having a substituent such as a phenyl group and a 4-methylphenyl group; and an alkoxyl group such as a methoxy group and an ethoxy group. As the substituent, one type thereof may be solely used, and two or more types thereof may also be used in combination at any ratio.

Examples of the alkyl group optionally having a substituent of $R^{3i}$ may include a methyl group, an ethyl group, a propyl group, an isopropyl group, a butyl group, an isobutyl group, a t-butyl group, a pentyl group, a neopentyl group, a benzyl group, and a neophyl group.

The number of carbon atoms in the aryl group optionally having a substituent of $R^{3i}$ is preferably 6 to 20, and more preferably 6 to 15. Examples of the substituent may include an alkyl group such as a methyl group and an ethyl group; a halogen atom such as a fluorine atom, a chlorine atom, and a bromine atom; and an alkoxy group such as a methoxy group, an ethoxy group, and an isopropoxy group. AS the substituent, one type thereof may be solely used, and two or more types thereof may also be used in combination at any ratio.

Examples of the aryl group optionally having a substituent of $R^{3i}$ may include a phenyl group, a 1-naphthyl group, a 2-naphthyl group, a 4-methylphenyl group, and a 2,6-dimethylphenyl group.

Among these, the group represented by $R^{3i}$ is preferably an alkyl group of 1 to 20 carbon atoms.

In Formula (1), $R^{2i}$ is a group selected from the group consisting of an alkyl group optionally having a substituent and an aryl group optionally having a substituent. As each of the alkyl group optionally having a substituent and the aryl group optionally having a substituent of $R^{2i}$, any group selected from ranges that have been enumerated as the alkyl groups optionally having a substituent and the aryl groups optionally having a substituent of $R^{3i}$ may be used.

In the formula (1), $X^i$ is a group selected from the group consisting of a halogen atom, an alkyl group optionally having a substituent, an aryl group optionally having a substituent, and an alkylsilyl group.

Examples of the halogen atom of $X^i$ may include a chlorine atom, a bromine atom, and an iodine atom.

As each of the alkyl group optionally having a substituent and the aryl group optionally having a substituent of $X^i$, any group selected from ranges that have been enumerated as the alkyl groups optionally having a substituent and the aryl groups optionally having a substituent of $R^{3i}$ may be used.

Examples of the alkylsilyl group of $X^i$ may include a trimethylsilyl group, a triethylsilyl group, and a t-butyldimethylsilyl group.

When the metal compound represented by the formula (1) has two or more $X^i$'s in the molecule, the $X^i$'s may be the same or different from each other. Further, the two or more $X^i$'s may be bonded to each other to form a ring structure.

In the formula (1), L is a neutral electron donor ligand.

Examples of the neutral electron donor ligand of L may include an electron donor compound containing an atom of the Group 14 or 15 in the periodic table. Specific examples thereof may include phosphines such as trimethylphosphine, triisopropylphosphine, tricyclohexylphosphine, and triphenylphosphine; ethers such as diethyl ether, dibutyl ether, 1,2-dimethoxyethane, and tetrahydrofuran; and amines such as trimethylamine, triethylamine, pyridine, and lutidine. Among these, ethers are preferable. When the metal compound represented by the formula (1) has two or more L's in the molecule, L's may be the same or different from each other.

The metal compound represented by the formula (1) is preferably a tungsten compound having a phenylimido group. That is, a metal compound represented by the formula (1) wherein M is a tungsten atom and $R^{1i}$ is a phenyl group is preferable. In particular, a tetrachlorotungsten phenylimide(tetrahydrofuran) complex is more preferable.

The method for producing the metal compound represented by the formula (1) is not particularly limited. As described in Japanese Patent Application Laid-open No. Hei. 5-345817 A, the metal compound represented by the formula (1) may be produced by mixing an oxyhalogenated product of a Group 6 transition metal; a phenyl isocyanate optionally having a substituent on one or more of the positions 3, 4, and 5 or a monosubstituted methyl isocyanate; a neutral electron donor ligand (L); and if necessary, an alcohol, a metal alkoxide, and a metal aryloxide.

In the aforementioned production method, the metal compound represented by the formula (1) is usually obtained in a state where the compound is contained in a reaction liquid. After production of the metal compound, the aforementioned reaction liquid as it is may be used as a catalyst liquid for the ring-opening polymerization reaction. Alternatively, after the metal compound is isolated from the reaction liquid and purified by a purification treatment such as crystallization, the resulting metal compound may be subjected to the ring-opening polymerization reaction.

As the ring-opening polymerization catalyst, the metal compound represented by the formula (1) may be solely used. Alternatively, the metal compound represented by the formula (1) may also be used in combination with another component. For example, the metal compound represented by the formula (1) may be used in combination with an organometallic reducing agent, to improve polymerization activity.

Examples of the organometallic reducing agent may include organometallic compounds of Groups 1, 2, 12, 13, and 14 in the periodic table, having a hydrocarbon group of 1 to 20 carbon atoms. Examples of such organometallic compounds may include an organolithium such as methyllithium, n-butyllithium, and phenyllithium; an organomagnesium such as butylethylmagnesium, butyloctylmagnesium, dihexylmagnesium, ethylmagnesium chloride, n-butylmagnesium chloride, and allylmagnesium bromide; an organozinc such as dimethylzinc, diethylzinc, and diphenylzinc; an organoaluminum such as trimethylaluminum, triethylaluminum, triisobutylaluminum, diethylammonium chloride, ethylaluminum sesquichloride, ethylaluminum dichloride, diethylaluminum ethoxide, diisobutylaluminum isobutoxide, ethylaluminum diethoxide, and isobutylaluminum diisobutoxide; and an organotin such as tetramethyltin, tetra(n-butyl)tin, and tetraphenyltin. Among these, an organoaluminum and an organotin are preferable. As the organometallic reducing agent, one type thereof may be solely used, and two or more types thereof may also be used in combination at any ratio.

The ring-opening polymerization reaction is usually performed in an organic solvent. As the organic solvent, an organic solvent that allows the ring-opening polymer and a hydrogenated product thereof to be dissolved or dispersed under specific conditions and does not inhibit the ring-opening polymerization reaction and a hydrogenation reaction may be used. Examples of such an organic solvent may include an aliphatic hydrocarbon solvent such as pentane, hexane, and heptane; an alicyclic hydrocarbon solvent such as cyclopentane, cyclohexane, methylcyclohexane, dimethylcyclohexane, trimethylcyclohexane, ethylcyclohexane, diethylcyclohexane, decahydronaphthalene, bicycloheptane, tricyclodecane, hexahydroindene, and cyclooctane; an aromatic hydrocarbon solvent such as benzene, toluene, and xylene; a halogen-containing aliphatic hydrocarbon solvent such as dichloromethane, chloroform, and 1,2-dichloroethane; a halogen-containing aromatic hydrocarbon solvent such as chlorobenzene and dichlorobenzene; a nitrogen-containing hydrocarbon solvent such as nitromethane, nitrobenzene, and acetonitrile; an ether solvent such as diethyl ether and tetrahydrofuran; and a mixed solvent obtained by combining them. Among these, the organic solvent is preferably an aromatic hydrocarbon solvent, an aliphatic hydrocarbon solvent, an alicyclic hydrocarbon solvent, or an ether solvent.

The ring-opening polymerization reaction may be initiated by mixing the cyclic olefin monomer, the metal compound represented by the formula (1), and if necessary, the organometallic reducing agent. The order of mixing the components is not particularly limited. For example, a solution containing the metal compound represented by the formula (1) and the organometallic reducing agent may be mixed with a solution containing the cyclic olefin monomer. Alternatively, a solution containing the cyclic olefin monomer and the metal compound represented by the formula (1) may be mixed with a solution containing the organometallic reducing agent. Further, a solution containing the metal compound represented by the formula (1) may be mixed with a solution containing the cyclic olefin monomer and the organometallic reducing agent. When the respective components are mixed, the total amount of each of the components may be mixed at a time, or the components may be mixed over a plurality of times. The components may be continuously mixed over a relatively long period of time (for example, one or more minute).

The concentration of the cyclic olefin monomer in the reaction liquid at initiation of the ring-opening polymerization reaction is preferably 1% by weight or more, more preferably 2% by weight or more, and particularly preferably 3% by weight or more, and is preferably 50% by weight or less, more preferably 45% by weight or less, and particularly preferably 40% by weight or less. When the concentration of the cyclic olefin monomer is equal to or more than the lower limit value of the aforementioned range, productivity can be enhanced. When the concentration is equal to or less than the upper limit value thereof, viscosity of the reaction liquid after the ring-opening polymerization reaction can be decreased. Consequently, a subsequent hydrogenation reaction can be easily performed.

The amount of the metal compound represented by the formula (1) used in the ring-opening polymerization reaction is desirably set so that the ratio by mole of "metal compound:cyclic olefin monomer" falls within a predetermined range. Specifically, the aforementioned ratio by mole is preferably 1:100 to 1:2,000,000, more preferably 1:500 to 1,000,000, and particularly preferably 1:1,000 to 1:500,000. When the amount of the metal compound is equal to or more than the lower limit value of the aforementioned range, sufficient polymerization activity can be obtained. When the amount is equal to or less than the upper limit value thereof, the metal compound can be easily removed after the reaction.

The amount of the organometallic reducing agent is preferably 0.1 mol or more, more preferably 0.2 mol or more, and particularly preferably 0.5 mol or more, and is preferably 100 mol or less, more preferably 50 mol or less, and particularly preferably 20 mol or less, relative to 1 mol of the metal compound represented by the formula (1). When the amount of the organometallic reducing agent is equal to or more than the lower limit value of the aforementioned range, polymerization activity can be sufficiently enhanced. When the amount is equal to or less than the upper limit value thereof, occurrence of a side reaction can be suppressed.

A polymerization reaction system of the polymer ($\alpha$) may contain an activity modifier. When the activity modifier is used, the ring-opening polymerization catalyst can be stabilized, the reaction speed of the ring-opening polymerization reaction can be adjusted, and the molecular weight distribution of the polymer can be adjusted.

As the activity modifier, an organic compound having a functional group may be used. Examples of the activity modifier may include an oxygen-containing compound, a nitrogen-containing compound, and a phosphorus-containing organic compound.

Examples of the oxygen-containing compound may include ethers such as diethyl ether, diisopropyl ether, dibutyl ether, anisole, furan, and tetrahydrofuran; ketones such as acetone, benzophenone, and cyclohexanone; and esters such as ethyl acetate.

Examples of the nitrogen-containing compound may include nitriles such as acetonitrile and benzonitrile; amines such as triethylamine, triisopropylamine, quinuclidine, and N,N-diethylaniline; and pyridines such as pyridine, 2,4-lutidine, 2,6-lutidine, and 2-t-butylpyridine.

Examples of the phosphorus-containing compound may include phosphines such as triphenylphosphine, tricyclohexylphosphine, triphenyl phosphate, and trimethyl phosphate; and phosphine oxides such as triphenylphosphine oxide.

As the activity modifier, one type thereof may be solely used, and two or more types thereof may also be used in combination at any ratio.

The amount of the activity modifier in the polymerization reaction system of the polymer ($\alpha$) is preferably 0.01% by mole to 100% by mole relative to 100% by mole of the metal compound represented by the formula (1).

The polymerization reaction system of the polymer ($\alpha$) may contain a molecular weight modifier to adjust the molecular weight of the polymer ($\alpha$). Examples of the molecular weight modifier may include $\alpha$-olefins such as 1-butene, 1-pentene, 1-hexene, and 1-octene; an aromatic vinyl compound such as styrene and vinyltoluene; an oxygen-containing vinyl compound such as ethyl vinyl ether, isobutyl vinyl ether, allyl glycidyl ether, allyl acetate, allyl alcohol, and glycidyl methacrylate; a halogen-containing vinyl compound such as allyl chloride; a nitrogen-containing vinyl compound such as acrylamide; a non-conjugated diene such as 1,4-pentadiene, 1,4-hexadiene, 1,5-hexadiene, 1,6-heptadiene, 2-methyl-1,4-pentadiene, and 2,5-dimethyl-1,5-hexadiene; and a conjugated diene such as 1,3-butadiene, 2-methyl-1,3-butadiene, 2,3-dimethyl-1,3-butadiene, 1,3-pentadiene and 1,3-hexadiene.

As the molecular weight modifier, one type thereof may be solely used, and two or more types thereof may also be used in combination at any ratio.

The amount of the molecular weight modifier in the polymerization reaction system for polymerization of the polymer ($\alpha$) may be adequately determined depending on a target molecular weight. Specifically, the amount of the molecular weight modifier preferably falls within a range of 0.1% by mole to 50% by mole relative to the cyclic olefin monomer.

The polymerization temperature is preferably $-78°$ C. or higher, and more preferably $-30°$ C. or higher, and is preferably $+200°$ C. or lower, and more preferably $+180°$ C. or lower.

The polymerization time may depend on the reaction scale. Specifically, the polymerization time preferably falls within a range of 1 minute to 1,000 hours.

The polymer ($\alpha$) is obtained by the aforementioned production method. By the hydrogenation of the polymer ($\alpha$), the polymer ($\beta$) can be produced.

For example, the polymer ($\alpha$) may be hydrogenated by supplying hydrogen to a reaction system containing the polymer ($\alpha$) in the presence of a hydrogenation catalyst in accordance with an ordinary method. When a reaction condition is adequately set in this hydrogenation reaction, tacticity of a hydrogenated product dose not usually alter by the hydrogenation reaction.

As the hydrogenation catalyst, a homogeneous catalyst or heterogeneous catalyst that is publicly known as a hydrogenation catalyst for an olefin compound may be used.

Examples of the homogeneous catalyst may include a catalyst including a combination of a transition metal compound and an alkali metal compound, such as cobalt acetate/triethylaluminum, nickel acetylacetonate/triisobutylaluminum, titanocene dichloride/n-butyllithium, zirconocene dichloride/sec-butyllithium, and tetrabutoxy titanate/dimethylmagnesium; and a noble metal complex catalyst such as dichlorobis(triphenylphosphine)palladium, chlorohydridecarbonyltris(triphenylphosphine)ruthenium, chlorohydridecarbonylbis(tricyclohexylphosphine)ruthenium, bis(tricyclohexylphosphine)benzylidyne ruthenium (IV) dichloride, and chlorotris(triphenylphosphine)rhodium.

Examples of the heterogeneous catalyst may include a metal catalyst such as nickel, palladium, platinum, rhodium, and ruthenium; and a solid catalyst in which the metal is supported on a carrier such as carbon, silica, diatomaceous earth, alumina, or titanium oxide, such as nickel/silica, nickel/diatomaceous earth, nickel/alumina, palladium/carbon, palladium/silica, palladium/diatomaceous earth, and palladium/alumina.

As the hydrogenation catalyst, one type thereof may be solely used, and two or more types thereof may also be used in combination at any ratio.

The hydrogenation reaction is usually performed in an inert organic solvent. Examples of the inert organic solvent may include an aromatic hydrocarbon solvent such as benzene and toluene; an aliphatic hydrocarbon solvent such as pentane and hexane; an alicyclic hydrocarbon solvent such as cyclohexane and decahydronaphthalene; and an ether solvent such as tetrahydrofuran and ethylene glycol dimethyl ether. As the inert organic solvent, one type thereof may be solely used, and two or more types thereof may also be used in combination at any ratio. The inert organic solvent may be the same as or different from the organic solvent used in the ring-opening polymerization reaction. Further, the hydrogenation catalyst may be mixed with the reaction liquid of the ring-opening polymerization reaction for performing the hydrogenation reaction.

The reaction conditions for the hydrogenation reaction is usually varied depending on the hydrogenation catalyst used.

The reaction temperature of the hydrogenation reaction is preferably −20° C. or higher, more preferably −10° C. or higher, and particularly preferably 0° C. or higher, and is preferably +250° C. or lower, more preferably +220° C. or lower, and particularly preferably +200° C. or lower. When the reaction temperature is equal to or more than the lower limit value of the aforementioned range, the reaction speed can be increased. When the reaction temperature is equal to or less than the upper limit value thereof, occurrence of a side reaction can be suppressed.

The hydrogen pressure is preferably 0.01 MPa or more, more preferably 0.05 MPa or more, and particularly preferably 0.1 MPa or more, and is preferably 20 MPa or less, more preferably 15 MPa or less, and particularly preferably 10 MPa or less. When the hydrogen pressure is equal to or more than the lower limit value of the aforementioned range, the reaction speed can be increased. When the hydrogen pressure is equal to or less than the upper limit value thereof, a special device such as a high pressure-resistant reaction device is not necessary. Therefore, a facility cost can be suppressed.

The reaction time of the hydrogenation reaction may be set to any time in which a desired hydrogenation ratio is achieved, and is preferably 0.1 hours to 10 hours.

After the hydrogenation reaction, the polymer (β) that is the hydrogenated product of the polymer (α) is collected usually in accordance with an ordinary method.

The hydrogenation ratio (the ratio of main-chain double bond hydrogenated) in the hydrogenation reaction is preferably 98% or more, and more preferably 99% or more. As the hydrogenation ratio is higher, the heat resistance of the alicyclic structure-containing polymer can be improved.

Herein, the hydrogenation ratio of the polymer may be measured by $^1$H-NMR measurement at 145° C. using o-dichlorobenzene-d$^4$ as a solvent.

Subsequently, methods for producing the polymers (γ) and (δ) will be described.

As the cyclic olefin monomer used in production of the polymers (γ) and (δ), any cyclic olefin monomer selected from the range enumerated as the cyclic olefin monomers usable in the production of the polymers (α) and (β) may be used. As the cyclic olefin monomer, one type thereof may be solely used, and two or more types thereof may also be used in combination at any ratio.

In production of the polymer (γ), an optional monomer copolymerizable with the cyclic olefin monomer may be used as a monomer in combination with the cyclic olefin monomer. Examples of the optional monomer may include an α-olefin of 2 to 20 carbon atoms such as ethylene, propylene, 1-butene, 1-pentene, and 1-hexene; an aromatic vinyl compound such as styrene and α-methylstyrene; and a non-conjugated diene such as 1,4-hexadiene, 4-methyl-1,4-hexadiene, 5-methyl-1,4-hexadiene, and 1,7-octadiene. Among these, an α-olefin is preferable, and ethylene is more preferable. As the optional monomer, one type thereof may be solely used, and two or more types thereof may also be used in combination at any ratio.

The ratio by weight of the cyclic olefin monomer relative to the optional monomer (cyclic olefin monomer:optional monomer) is preferably 30:70 to 99:1, more preferably 50:50 to 97:3, and particularly preferably 70:30 to 95:5.

When two or more types of the cyclic olefin monomers are used or the cyclic olefin monomer and the optional monomer are used in combination, the polymer (γ) may be a block copolymer, and may also be a random copolymer.

In synthesis of the polymer (γ), an addition polymerization catalyst is usually used. Examples of such an addition polymerization catalyst may include a vanadium-containing catalyst formed from a vanadium compound and an organoaluminum compound, a titanium-containing catalyst formed from a titanium compound and an organoaluminum compound, and a zirconium-containing catalyst formed from a zirconium complex and aluminoxane. As the addition polymer catalyst, one type thereof may be solely used, and two or more types thereof may also be used in combination at any ratio.

The amount of the addition polymerization catalyst is preferably 0.000001 mol or more, and more preferably 0.00001 mol or more, and is preferably 0.1 mol or less, and more preferably 0.01 mol or less, relative to 1 mol of the monomer.

The addition polymerization of the cyclic olefin monomer is usually performed in an organic solvent. As the organic solvent, any organic solvent selected from the range enumerated as the organic solvents usable in the ring-opening polymerization of the cyclic olefin monomer may be used. As the organic solvent, one type thereof may be solely used, and two or more types thereof may also be used in combination at any ratio.

The polymerization temperature in the polymerization for producing the polymer (γ) is preferably −50° C. or higher, more preferably −30° C. or higher, and is particularly preferably −20° C. or higher, and preferably 250° C. or lower, more preferably 200° C. or lower, and particularly preferably 150° C. or lower. The polymerization time is preferably 30 minutes or more, and more preferably 1 hour or more, and is preferably 20 hours or less, and more preferably 10 hours or less.

The polymer (γ) is obtained by the aforementioned production method. By the hydrogenation of the polymer (γ), the polymer (δ) can be produced.

The polymer (γ) may be hydrogenated by the same method as described as the method for hydrogenating the polymer (α).

It is preferable that the alicyclic structure-containing crystallizable polymer described above has a syndiotactic structure. It is more preferable that the degree of syndiotactic stereoregularity thereof is high. Thereby the crystallizability of the alicyclic structure-containing polymer can be enhanced. Consequently, the tensile elastic modulus can be particularly increased. The degree of syndiotactic stereoregularity of the alicyclic structure-containing polymer may be represented as a ratio of racemo diad of the alicyclic structure-containing polymer. Specifically, the ratio of the racemo diad of the alicyclic structure-containing polymer is preferably 51% or more, more preferably 60% or more, and particularly preferably 70% or more.

The ratio of racemo diad may be measured by $^{13}$C-NMR spectrometry. Specifically, the measurement may be performed by the following method.

A polymer sample is subjected to $^{13}$C-NMR measurement at 200° C. by an inverse-gated decoupling method using o-dichlorobenzene-d$^4$ as a solvent. From the result of the $^{13}$C-NMR measurement, the ratio of racemo diad of the polymer sample may be determined on the basis of intensity ratio of a signal at 43.35 ppm derived from a meso diad and a signal at 43.43 ppm derived from a racemo diad relative to a peak at 127.5 ppm of o-dichlorobenzene-d$^4$ as a reference shift.

The ratio of the crystallizable polymer in the crystallizable resin is preferably 50% by weight or more, more preferably 70% by weight or more, and particularly preferably 90% by weight or more. When the ratio of the crystallizable polymer is equal to or more than the lower limit value of the aforementioned range, heat resistance and tensile elastic modulus of the first substrate can be enhanced.

Crystallization of the crystallizable polymer contained in the first substrate does not have to be in a proceeded state before the production of the first substrate. However, it is preferable that the crystallization is in a sufficiently proceeded state after the production of the first substrate. Specifically, the range of crystallization degree of the crystallizable polymer contained in the first substrate is preferably 10% or more, more preferably 15% or more, and particularly preferably 20% or more. When the crystallization degree is equal to or more than the lower limit value of the aforementioned range, high heat resistance, chemical resistance, and tensile elastic modulus can be imparted to the first substrate. The upper limit of the crystallization degree is not particularly limited. From the viewpoint of transparency of the first substrate, the upper limit is preferably 70% or less, more preferably 60% or less, and particularly preferably 50% or less. The crystallization degree of the polymer may be measured by an X-ray diffraction method.

The resin as the material for the first substrate may contain an optional component in combination with the aforementioned polymer. Examples of the optional component may include an antioxidant such as a phenolic antioxidant, a phosphorus-containing antioxidant, and an sulfur-containing antioxidant; a light stabilizer such as a hindered amine-based light stabilizer; a wax such as a petroleum-based wax, Fischer-Tropsch Wax, and polyalkylene wax; a nucleating agent such as a sorbitol-based compound, a metal salt of an organic phosphoric acid, a metal salt of an organic carboxylic acid, kaolin, and talc; a fluorescent whitening agent such as a diaminostilbene derivative, a coumarin derivative, an azole-based derivative (for example, a benzoxazole derivative, a benzotriazole derivative, a benzimidazole derivative, and a benzotiazole derivative), a carbazole derivative, a pyridine derivative, a naphthalic acid derivative, and an imidazolone derivative; an ultraviolet absorber such as a benzophenone-based ultraviolet absorber, a salicylic acid-based ultraviolet absorber, and a benzotriazole-based ultraviolet absorber; an inorganic filler such as talc, silica, calcium carbonate, and glass fibers; a colorant; a flame retardant; a flame retardant promoter; an antistatic agent; a plasticizer; a near-infrared absorber; a lubricant; and fillers. As the optional component, one type thereof may be solely used, and two or more types thereof may also be used in combination at any ratio.

It is preferable that the first substrate has a slow axis. The slow axis is usually generated by orientation of molecules of the polymer contained in the first substrate. When the molecules of the polymer contained in the first substrate are oriented, an orientation regulating force corresponding to the orientation direction thereof is generated on the first substrate. Therefore, the first substrate having a slow axis has a favorable orientation regulating force. Such a slow axis may be generated by stretching.

The slow axis direction of the first substrate may be set depending on optical properties required for the optically anisotropic layer. In particular, it is preferable that a long-length first substrate has a slow axis in an oblique direction that is not parallel to or perpendicular to the widthwise direction of the first substrate. Specifically, the range of orientation angle of the slow axis of the first substrate relative to the widthwise direction of the first substrate is preferably 10° or more, more preferably 30° or more, and particularly preferably 40° or more, and is preferably 85° or less, more preferably 80° or less, and particularly preferably 75° or less. When the orientation angle of the first substrate falls within the aforementioned range, the slow axis direction of the optically anisotropic layer formed on the first substrate can be set to an oblique direction. Consequently, the optically anisotropic layer can be used for a member suitable for efficient production of a circularly polarizing plate. In a certain embodiment, the orientation angle of the first substrate may fall within a specific range of preferably 15°±5°, 45°±5°, 67.5°±5°, or 75°±5°, more preferably 15°±4°, 45°±4°, 67.5°±40, or 75°±4°, and further preferably 15°±3°, 45°±3°, 67.5°±3°, or 75°±3°.

It is preferable that the first substrate has optical anisotropy. Therefore, it is preferable that the first substrate has a birefringence Δn. Specifically, the birefringence Δn of the first substrate is preferably 0.0010 or more, more preferably 0.0030 or more, and particularly preferably 0.010 or more, and is preferably 0.100 or less, more preferably 0.090 or less, and particularly preferably 0.060 or less. In a first substrate having such a birefringence Δn, molecular directors are usually oriented in almost uniform manner over the entirety of the thickness direction. Therefore, a favorable orientation regulating force can be imparted to the first substrate. Accordingly, relaxation of orientation regulating force over the lapse of time due to effects of environment (heat, light, oxygen, etc.) can be effectively suppressed as compared with a first substrate in which the orientation regulating force is imparted to only a surface layer by a treatment such as a rubbing treatment.

It is preferable that the first substrate has excellent transparency. Specifically, the total light transmittance of the first substrate is preferably 80% or more, more preferably 85% or more, and particularly preferably 88% or more. The total light transmittance of the first substrate may be measured at a wavelength range of 400 nm to 700 nm using an ultraviolet-visible spectrophotometer.

It is preferable that the first substrate has a small haze. Specifically, the haze of the first substrate is preferably 5% or less, more preferably 3% or less, and particularly preferably 1% or less. The haze of the first substrate may be measured by cutting out the first substrate at a randomly selected portion to obtain a thin-layer sample having a square shape of 50 mm×50 mm, and then measuring the haze of the thin-layer sample using a haze meter.

It is preferable that the first substrate has a low water absorption. Specifically, the water absorption of the first substrate is preferably 0.1% or less, more preferably 0.08% or less, and particularly preferably 0.05% or less.

The water absorption may be measured by the following method. The first substrate is cut out at a randomly selected portion to obtain a thin-layer sample having a square shape of 150 mm×150 mm. The weight of the sample is measured. This sample is then immersed in water at 23° C. for 24 hours, and the weight of the sample after immersion is measured. Then, the ratio of weight of the sample increased as a result of the immersion relative to the weight of the sample before the immersion may be calculated as the water absorption (%).

It is preferable that the absolute value of size change rate of the first substrate is small. Specifically, the absolute value of thermal size change rate after heating at 150° C. for 1 hour is preferably 1% or less, more preferably 0.5% or less, and particularly preferably 0.1% or less in any in-plane direction of the film.

The thermal size change rate may be measured by the following method.

The first substrate is cut out at randomly selected portion to obtain a thin-layer sample having a square shape of 150 mm×150 mm. The sample is heated in an oven of 150° C. for 60 minutes and cooled to 23° C. (room temperature). The lengths of four sides and two diagonal corner-to-corner lines of the sample are then measured. The thermal size change rate based on the measured length of each of four sides is calculated by the following equation (a). In the equation (a), $L_A$ is the length of each side of the heated sample.

$$\text{Thermal size change rate (\%)} = [(L_A - 150)/150] \times 100 \quad (a)$$

The thermal size change rate based on the measured length of each of two diagonal corner-to-corner lines is calculated by the following Equation (b). In Equation (b), $L_D$ is the length of each diagonal corner-to-corner line of the heated sample.

$$\text{Thermal size change rate (\%)} = [(L_D - 212.13)/212.13] \times 100 \quad (b)$$

The value whose absolute value was the maximum among six calculated values of thermal size change rate may be adopted as the thermal size change rate (%) of the first substrate. When thermal expansion is high, the thermal size change rate is large.

The first substrate may have retardation according to its application. For example, when the multilayer film is used as an optical film such as a phase difference film or an optical compensation film, it is preferable that the first substrate has retardation. The in-plane retardation Re of the first substrate at a measurement wavelength of 590 nm is preferably 30 nm or more, and more preferably 50 nm or more, and is preferably 500 nm or less, and more preferably 300 nm or less.

The thickness of the first substrate is preferably 1 µm or more, more preferably 3 µm or more, and particularly preferably 10 µm or more, and is preferably 1 mm or less, more preferably 500 µm or less, and particularly preferably 200 m or less. When the thickness of the first substrate is equal to or more than the lower limit value of the aforementioned range, appropriate strength can be obtained. When the thickness is equal to or less than the upper limit value thereof, winding of the multilayer film in the production thereof wherein the film is in a long-length shape can be achieved.

[3. Method for Producing First Substrate]

The first substrate may usually be produced by a production method including a step of, after preparing a resin film, subjecting the resin film to a treatment of imparting the orientation regulating force. Examples of the treatment of imparting the orientation regulating force to the resin film may include a light orientation treatment, a rubbing treatment, an ion beam irradiation treatment, a vapor deposition film formation treatment, and a stretching treatment. Among these, a stretching treatment is preferable. Hereinafter, as one example of the method for producing the first substrate, a method in which a resin film formed of the crystallizable resin containing the crystallizable polymer is subjected to a stretching treatment to obtain the first substrate will be described.

The method for producing the first substrate exemplified herein includes steps of preparing a pre-stretch film as the resin film formed of the crystallizable resin, stretching the pre-stretch film to obtain a stretched film, and relaxing strain of the stretched film while maintaining the stretched film in a flat state, to obtain the first substrate. It is preferable that this method includes a step of promoting crystallization of the crystallizable polymer contained in the stretched film before relaxing the strain of the stretched film after obtaining the stretched film.

[3.1. Step of Producing Pre-Stretch Film]

In the aforementioned method, the step of preparing a pre-stretch film is performed. For example, the pre-stretch film may be produced by molding the crystallizable resin into a film shape through a resin molding method such as an injection molding method, an extrusion molding method, a press molding method, an inflation molding method, a blow molding method, a calendar molding method, a cast molding method, or a compression molding method. Among these, an extrusion molding method is preferable since thickness thereof can be easily controlled.

When the pre-stretch film is produced by the extrusion molding method, production conditions in the extrusion molding method are preferably as follows. The temperature of a cylinder (melted resin temperature) is preferably Tm or higher, and more preferably Tm+20° C. or higher, and is preferably Tm+100° C. or lower, and more preferably Tm+50° C. or lower. The temperature of a casting roller is preferably Tg−50° C. or higher, and is preferably Tg+70° C. or lower, and more preferably Tg+40° C. or lower. The temperature of a cooling roller is preferably Tg−70° C. or higher, and more preferably Tg −50° C. or higher, and is preferably Tg+60° C. or lower, and more preferably Tg+30° C. or lower. Under such conditions for producing the pre-stretch film, a pre-stretch film having a thickness of 1 µm to 1 mm can be easily produced. Herein, "Tm" means the melting point of the crystallizable polymer, and "Tg" means the glass transition temperature of the crystallizable polymer.

[3.2. Stretching Treatment]

In the aforementioned production method, the stretching step of stretching the prepared pre-stretch film to obtain a stretched film is performed. The stretching direction may be appropriately set depending on a desired orientation direction required for the optically anisotropic layer.

The stretching method is not especially limited, and any stretching method may be adopted. Examples of the stretching method may include a uniaxial stretching method such as a method of uniaxially stretching the pre-stretch film in a lengthwise direction (longitudinal uniaxial stretching method) and a method of uniaxially stretching the pre-stretch film in a widthwise direction (transversal uniaxial stretching method); a biaxial stretching method such as a simultaneous biaxial stretching method of stretching the pre-stretch film in the widthwise direction at the same time as stretching the pre-stretch film in the lengthwise direction, and a sequential biaxial stretching method of stretching the pre-stretch film in one of the lengthwise and widthwise directions, followed by stretching the pre-stretch film in the other direction; and a method of stretching the pre-stretch film in an oblique direction that is not parallel to or perpendicular to the widthwise direction (oblique stretching method).

Examples of the longitudinal uniaxial stretching method may include a stretching method using a difference in a peripheral speed between rollers.

Examples of the transversal uniaxial stretching method may include a stretching method using a tenter stretching machine.

Examples of the simultaneous biaxial stretching method described above may include a stretching method using a tenter stretching machine provided with a plurality of clips that are provided so as to be movable along a guide rail and can grip the pre-stretch film. In this method, the pre-stretch film is stretched in the lengthwise direction by increasing intervals between the clips, and simultaneously stretched in the widthwise direction using a spreading angle of the guide rail.

Examples of the sequential biaxial stretching method may include a stretching method in which the pre-stretch film is stretched in the lengthwise direction using a difference in a peripheral speed between rollers, thereafter both ends of the pre-stretch film are gripped by clips, and the pre-stretch film is stretched in the widthwise direction by a tenter stretching machine.

Examples of the oblique stretching method may include a stretching method in which the pre-stretch film is continuously stretched in the oblique direction using a tenter stretching machine that is capable of applying a feeding force, pulling force, or drawing force at different speeds on right and left sides in the lengthwise or widthwise direction.

The stretching temperature during stretching the pre-stretch film is preferably (Tg−30° C.) or higher, more preferably (Tg−20° C.) or higher, and particularly preferably (Tg−10° C.) or higher, and is preferably (Tg+60° C.) or lower, more preferably (Tg+50° C.) or lower, and particularly preferably (Tg+40° C.) or lower. Herein, "Tg" means the glass transition temperature of the crystallizable polymer. When stretching is performed in such a temperature range, the polymer molecules contained in the stretched film can be appropriately oriented.

The stretching ratio during stretching the pre-stretch film is preferably 1.1 times or more, more preferably 1.2 times or more, and particularly preferably 1.5 times or more, and is preferably 20 times or less, more preferably 10 times or less, and particularly preferably 5 times or less. Herein, when stretching is performed in a plurality of different directions such as in the biaxial stretching method, the stretching ratio means a total stretching ratio that is represented by product of stretching ratios in the respective stretching directions. When the stretching ratio is equal to or less than the upper limit value of the aforementioned range, a possibility of breaking the film can be reduced. Therefore, the first substrate can be easily produced.

When the pre-stretch film is subjected to the stretching treatment described above, the polymer molecules in the film are oriented. Therefore, a stretched film having an orientation regulating force is obtained. Further, generation of large crystal grain in the crystallization promoting step can be usually suppressed by stretching. Therefore, whitening caused by the crystal grain can be suppressed. Consequently, the transparency of the first substrate can be enhanced. Moreover, optical anisotropy is usually imparted to the stretched film by stretching. Therefore, optical properties such as birefringence and retardation are exhibited.

[3.3. Crystallization Promoting Step]

After the stretched film is obtained, it is preferable to perform the crystallization promoting step of promoting crystallization of the polymer contained in the stretched film. When crystallization is promoted, the tensile elastic modulus of the stretched film can be effectively increased.

The crystallization may be promoted by adjusting the stretched film to a predetermined temperature. The temperature range in which crystallization is promoted may be optionally set within a temperature range that is equal to or higher than the glass transition temperature Tg of the crystallizable polymer and equal to or lower than the melting point Tm of the crystallizable polymer. In particular, it is preferable that the temperature range is set so that the speed of crystallization becomes fast. Specifically, the temperature range is preferably Tg+20° C. or higher, and more preferably Tg+30° C. or higher, and is preferably Tm−20° C. or lower, and more preferably Tm−40° C. or lower. When the temperature at which crystallization is promoted is equal to or more than the lower limit value of the aforementioned range, the crystallization can be effectively promoted. When the temperature is equal to or less than the upper limit value thereof, clouding of the first substrate can be suppressed.

In order to adjust the stretched film to the temperature described above, the stretched film is usually heated. It is preferable that the heating device for use in this operation is a heating device that may increase the ambient atmosphere temperature of the stretched film since such a heating device does not require contact with the stretched film. Specific examples of the suitable heating device may include an oven and a heating furnace.

It is preferable that the crystallization is promoted while the stretched film is held and strained. In this case, deformation of the stretched film due to thermal shrinkage during promoting the crystallization can be suppressed. Consequently, crystallization of the polymer in the stretched film can be promoted without impairing the smoothness of the stretched film. Herein, the state where the stretched film is strained means a state where a tension is applied to the stretched film. However, the state where the stretched film is strained does not include a state where the stretched film is substantially stretched. Further, substantially stretched means that the stretching ratio of the stretched film in any direction is usually 1.1 times or more.

When the stretched film is held, an appropriate holder is used for holding the stretched film. The holder may be a holder capable of continuously holding the stretched film or a holder capable of intermittently holding the stretched film with intervals. For example, the stretched film may be intermittently held by holders disposed at predetermined intervals.

The stretched film may be kept in a strained state by, for example, being held at two or more sides of the stretched film. By this holding, deformation of the stretched film due to thermal shrinkage is prevented in a region that is in a strained state by holding. In order to prevent deformation in a wide area of the stretched film, it is preferable that sides including two opposite sides of the stretched film are held to keep the region between the held sides in a strained state. For example, when two opposite sides (for example, both the long sides, or both the short sides) of a stretched film having a rectangular sheet piece shape are held to keep the region between the two opposite sides in a strained state, deformation is prevented in the entire surface of the stretched film having the sheet piece shape. As another example, when two sides at ends in the widthwise direction (i.e., both the long sides) of a stretched film having a long-length shape are held to keep the a region between the two sides in a strained state, deformation is prevented in the entire surface of the long-length stretched film. In such a stretched film in which the deformation is prevented as described above, even when a stress is generated in the film by thermal shrinkage, occurrence of deformation such as a wrinkle is suppressed. In this case, when sides including two sides orthogonal to the stretching direction (in a case of biaxial stretching, a direction in which the stretching ratio is larger) of the stretched film are held, a tension in the stretching direction is applied to strain the stretched film. Thus, deformation is especially effectively suppressed.

In order to effectively suppress deformation due to promotion of crystallization, it is preferable that a larger number of sides of the stretched film are held. For example, it is preferable that all sides of the stretched film having a sheet piece shape are held. Specifically, in the stretched film having a rectangular sheet piece shape, it is preferable that four sides thereof are held.

It is preferable that the holder capable of holding a side of the stretched film is a holder that does not come into contact with the stretched film at a part other than the side of the stretched film. When such a holder is used, a first substrate having more excellent smoothness can be obtained.

It is preferable that the holder is a holder capable of fixing relative position between the holders in the crystallization promoting step. Since such a holder does not alter the relative position between the holders in the crystallization promoting step, the holder tends to suppress substantial stretching and shrinkage of the stretched film.

Suitable examples of the holders may include grippers such as clips that are provided on a frame at predetermined intervals as holders for the rectangular stretched film and can grip the sides of the stretched film. Examples of holders for holding two sides at ends in the widthwise direction of the long-length stretched film may include grippers that are provided in a tenter stretching machine and can grip the sides of the stretched film.

The long-length stretched film may also be held on sides at ends in the lengthwise direction (i.e., both the short sides) of the stretched film. Instead of holding the aforementioned sides of the stretched film, both sides of the stretched film in the lengthwise direction of a treatment region where the stretched film is adjusted to a predetermined temperature for promotion of crystallization may be held. For example, on the both sides in the lengthwise direction of the treatment region of the stretched film, a holding device that can hold the stretched film to be in a strained state so that thermal shrinkage is not caused may be provided. Examples of the holding device may include a combination of two rollers and a combination of an extruder and a drawing roller. When a tension such as a conveyance tension is applied to the stretched film by any of such combinations, thermal shrinkage of the stretched film in the treatment region where the crystallization is promoted can be suppressed. Therefore, when the combination described above is used as the holding device, the stretched film can be held while the stretched film is conveyed in the lengthwise direction. Therefore, the first substrate can be efficiently produced.

By the crystallization promoting step, a stress in the film that may cause size change in a high-temperature environment is cancelled. Therefore, a first substrate having low thermal expansion and small thermal size change rate can be produced.

The treatment time during which the stretched film is maintained at a predetermined temperature for promotion of crystallization is preferably 1 second or more, and more preferably 5 seconds or more, and is preferably 30 minutes or less, and more preferably 10 minutes or less. When the treatment time is equal to or more than the lower limit value of the aforementioned range, crystallization of the polymer contained in the stretched film is sufficiently promoted. Thus, the heat resistance of the first substrate can be effectively enhanced. When the treatment time is equal to or less than the upper limit value of the aforementioned range, clouding of the first substrate can be suppressed.

[3.4. Relaxation Step]

After performing the crystallization promoting step if necessary, the relaxation step of relaxing the strain of the stretched film while maintaining the stretched film in a flat state to obtain the first substrate for removing a residual stress from the stretched film is performed.

The relaxation of strain of the stretched film means that the stretched film is released from the strained state where the stretched film is held by the stretching machine or the holding device for stretching or promotion of crystallization. When the stretched film is not strained, the stretched film may be held by the holding device. When the strain is relaxed as described above, the stretched film becomes in a state that allows thermal shrinkage. In the relaxation step, the stretched film is thermally shrunk, and as a result, a stress that may be generated in the first substrate during heating is canceled. Consequently, thermal shrinkage of the first substrate in a high-temperature environment can be reduced. As a result, a first substrate having excellent size stability in a high-temperature environment is obtained.

The relaxation of the strain of the stretched film may be performed all at once, and may also be performed in a continuous or stepwise manner over a period of time. In order to suppress occurrence of deformation such as a waviness and a wrinkle of the first substrate to be obtained, it is preferable to perform relaxation of the strain in a continuous or stepwise manner.

The relaxation of the strain of the stretched film described above is performed while maintaining the stretched film in a flat state. Herein, to maintain the stretched film in a flat state means that the stretched film is kept in a plane shape so that deformation such as a waviness and a wrinkle is not caused. Thereby occurrence of deformation such as a waviness and a wrinkle of the first substrate to be obtained can be suppressed.

The treatment temperature of the stretched film during relaxation of the strain may be set within a temperature range that is equal to or higher than the glass transition temperature Tg of the crystallizable polymer and equal to or lower than the melting point Tm of the crystallizable polymer. Specifically, the treatment temperature is preferably Tg+20° C. or higher, and more preferably Tg+30° C. or higher, and is preferably Tm−20° C. or lower, and more preferably Tm−40° C. or lower. When the relaxation step is performed without cooling after the crystallization promoting step, it is preferable that the treatment temperature of the stretched film in the relaxation step is the same as the temperature in the crystallization promoting step. Thereby temperature unevenness of the stretched film in the relaxation step can be reduced, and the productivity of the first substrate can be enhanced.

The treatment time of maintaining the temperature of the stretched film within the aforementioned temperature range in the relaxation step is preferably 1 second or more, and more preferably 5 seconds or more, and is preferably 10 minutes or less. When the treatment time is equal to or more than the lower limit value of the aforementioned range, size stability of the first substrate in a high-temperature environment can be efficiently enhanced. When the treatment time is equal to or less than the upper limit value thereof, size stability of the first substrate in a high-temperature environment can be efficiently enhanced, and clouding of the first substrate due to advance of crystallization in the relaxation step can be suppressed.

When the strain of the stretched film having a sheet piece shape is relaxed in the relaxation step, for example, a method in which an interval between held portions is decreased in a continuous or stepwise manner while four sides of the stretched film are held may be adopted. In this case, the interval between the held portions on the four sides of the stretched film may be simultaneously decreased. After the interval between the held portions on a part of the sides is decreased, the interval between the held portions on another part of the sides may be decreased. Further, the interval between the held portions on a part of the sides may be maintained without decrease. Alternatively, the interval between the portions held on a part of the sides may be decreased in a continuous or stepwise manner, while the interval between the held portions on another part of the sides may be decreased at once.

When the strain of the long-length stretched film is relaxed in the relaxation step as described above, for example, a method wherein, with the use a tenter stretching machine, an interval between guide rails that may guide clips is decreased in the conveyance direction of the stretched film, or an interval between adjacent clips is decreased may be adopted.

When relaxation of the strain of the stretched film is performed by decreasing the interval between the held portions while the stretched film is held as described above, the degree of decreasing the interval may be set depending on a stress remaining in the stretched film. When a thermal shrinkage ratio in a state where the stretched film is not strained at the treatment temperature in the relaxation step is represented by S (%), the specific degree of decreasing the held interval in the relaxation step is preferably 0.1S or more, more preferably 0.5S or more, and particularly preferably 0.7S or more, and is preferably 1.2S or less, more preferably 1.0S or less, and particularly preferably 0.95S or less. For example, when the thermal shrinkage ratio S is anisotropic, in which thermal shrinkage ratios S in two orthogonal directions are different, the degree of decreasing the held interval may be set within the aforementioned range in each direction. When the degree falls within such a range, the residual stress of the first substrate can be sufficiently removed and flatness can be maintained.

The aforementioned thermal shrinkage ratio S may be measured by the following method.

The stretched film is cut out in an environment at a room temperature of 23° C., to obtain a sample film having a square shape of 150 mm×150 mm. This sample film is heated for 60 minutes in an oven which is set to the same temperature as the treatment temperature in the relaxation step, and cooled to 23° C. (room temperature). After that, the lengths of two sides parallel to a direction in which the thermal shrinkage ratio S of the sample film is to be determined are measured.

The thermal shrinkage ratio S of the sample film based on the measured length of each of two sides is calculated by the following Equation (A). In Equation (A), $L_1$ is the length of one of the measured two sides of the heated sample film, and $L_2$ is the length of the other side.

$$\text{Thermal shrinkage ratio } S(\%)=[(300-L_1-L_2)/300]\times 100 \qquad (A)$$

[4. Configuration of Optically Anisotropic Layer]

The multilayer film of the present invention is provided with an optically anisotropic layer that is formed directly on the first substrate and contains the cured liquid crystal molecules. The formation of the optically anisotropic layer "directly" on the first substrate means that the optically anisotropic layer is formed on the surface of the first substrate without another layer interposed therebetween. Since the first substrate having high tensile elastic modulus is adopted and the optically anisotropic layer is formed directly on the first substrate, formation of a wrinkle on the surface of the optically anisotropic layer is suppressed.

In the optically anisotropic layer, the cured liquid crystal molecules are oriented in a direction corresponding to the orientation regulating force of the first substrate. For example, when the first substrate has an orientation regulating force generated by stretching, the cured liquid crystal molecules contained in the optically anisotropic layer may have orientation regularity along a direction that is approximately the same as the direction of slow axis of the first substrate.

It is preferable that the cured liquid crystal molecules has homogeneous orientation regularity along a direction that is approximately the same as the direction of slow axis of the first substrate. Herein, "having homogeneous orientation regularity" means that an average direction of lines obtained by projecting long-axis directions of mesogens of the cured liquid crystal molecules to a film face is aligned in a certain direction parallel to the film face (for example, direction of surface director of the first substrate). Further, the homogeneous orientation regularity "along" the certain direction means that the alignment direction is approximately the same as the certain direction described above. For example, the aforementioned certain direction is the direction of surface director of the first substrate or the direction of slow axis of the first substrate. The presence or absence of homogeneous orientation regularity of the cured liquid crystal molecules and the alignment direction thereof may be confirmed by measurement of the slow axis direction using a phase difference meter typified by AxoScan (manufactured by Axometrics, Inc.) and measurement of retardation distribution of each incidence angle in the slow axis direction.

Herein, when the cured liquid crystal molecules are obtained by polymerizing a polymerizable liquid crystal compound having a rod-shaped molecular structure, the long-axis direction of mesogen of the polymerizable liquid crystal compound is usually the long-axis direction of mesogen of the cured liquid crystal molecules. When a plurality of types of mesogens having different orientation directions are present in the optically anisotropic layer like a case where a polymerizable liquid crystal compound having inverse wavelength dispersion (described below) is used as the polymerizable liquid crystal compound, a direction in which the long-axis direction of the longest mesogen among the mesogens is aligned is adopted as the alignment direction.

Further, the orientation along a direction that is "approximately" the same as the direction of slow axis of the first substrate means that an angle formed between the direction of slow axis of the first substrate and the alignment direction of mesogen is 5° or less. The angle is preferably 3° or less, and more preferably 1° or less.

When the first substrate having a slow axis is used and a material for the optically anisotropic layer is appropriately selected, the orientation regularity such as homogeneous orientation regularity along the direction that is approximately the same as the slow axis direction of the first substrate can be imparted to the optically anisotropic layer. As a result, an optically anisotropic layer having such orientation regularity can be obtained.

Particularly, when a first substrate having an orientation regulating force generated by stretching is used, an optically anisotropic layer having a slow axis in a desired direction can be obtained without generation of dusts, generation of cracks, nor contamination of a foreign substance due to rubbing. As a result, an optically anisotropic layer having a reduced number of defects in orientation can be obtained. Specifically, an optically anisotropic layer having a reduced number of cracks and foreign substances that are observed by a microscope and a reduced number of orientation defects such as line defects can be obtained.

Such an optically anisotropic layer usually has a slow axis in a direction approximately parallel to the slow axis direction of the first substrate. Herein, that the slow axis direction of the optically anisotropic layer is "approximately parallel to" the slow axis of the first substrate means that an angle formed between the slow axis direction of the optically anisotropic layer and the slow axis of the first substrate is usually within ±5°, preferably within ±3°, and further preferably within ±1°.

When the optically anisotropic layer is in a long-length shape, the range of the orientation angle of the slow axis of the optically anisotropic layer relative to the widthwise direction of the optically anisotropic layer may be the same as that of the orientation angle of the first substrate. Specifically, the orientation angle of the optically anisotropic layer is preferably 10° or more, more preferably 30° or more, and particularly preferably 40° or more, and is preferably 85° or less, more preferably 80° or less, and particularly preferably 70° or less. In a certain embodiment, the orientation angle of the optically anisotropic layer may fall within a specific range of preferably 15°±5°, 45°±5°, 67.5°±5°, or 75°±5°, more preferably 15°±4°, 45°±4°, 67.5°±4°, or 75°±4°, and further preferably 15°±3°, 45°±3°, 67.5°±3°, or 75°±3°. When such an angle relationship is satisfied, the optically anisotropic layer can be used as a material that realizes efficient production of a circularly polarizing plate.

The retardation of the optically anisotropic layer may be set depending on application of the optically anisotropic layer. For example, when the in-plane retardation Re measured at a measurement wavelength of 590 nm of the optically anisotropic layer falls within a range of 108 nm to 168 nm, the optically anisotropic layer may be used as a ¼ wavelength plate. When the in-plane retardation Re measured at a measurement wavelength of 590 nm of the optically anisotropic layer falls within a range of 245 nm to 305 nm, the optically anisotropic layer may be used as a ½ wavelength plate. More specifically, when the optically anisotropic layer is used as a ¼ wavelength plate, the in-plane retardation Re measured at a measurement wavelength of 590 nm of the optically anisotropic layer is preferably 128 nm or more, and more preferably 133 nm or more, and is preferably 148 nm or less, and more preferably 143 nm or less. When the optically anisotropic layer is used as a ½ wavelength plate, the in-plane retardation Re measured at a measurement wavelength of 590 nm of the optically anisotropic layer is preferably 265 nm or more, and more preferably 270 nm or more, and is preferably 285 nm or less, and more preferably 280 nm or less.

It is preferable that the optically anisotropic layer has inverse wavelength dispersion. That is, it is preferable that the optically anisotropic layer has wavelength dispersion that exhibits higher in-plane retardation for transmitted light having longer wavelength as compared with transmitted light having shorter wavelength. It is preferable that the optically anisotropic layer has inverse wavelength dispersion in at least a part or preferably the entire visible light region. When the optically anisotropic layer has inverse wavelength dispersion, the layer can uniformly express functions over a wide region for optical applications such as a ¼ wavelength plate or a ½ wavelength plate.

The thickness of the optically anisotropic layer can be appropriately adjusted so that properties such as retardation fall within a desired range. Specifically, the thickness of the optically anisotropic layer is preferably 0.5 μm or more, more preferably 0.8 μm or more, and particularly preferably 1.0 μm or more, and is preferably 5 μm or less, more preferably 4 μm or less, and particularly preferably 3.5 μm or less.

There is no restriction on the shape as well as length and width of the optically anisotropic layer. Similarly to the first substrate, the optically anisotropic layer may be in a long-length shape or a sheet piece shape.

[5. Method for Forming Optically Anisotropic Layer]

The optically anisotropic layer may be usually formed by a method including steps of applying the liquid crystal composition containing the polymerizable liquid crystal compound directly onto the first substrate to form a layer of the liquid crystal composition; orienting the polymerizable liquid crystal compound in the layer of the liquid crystal composition; and polymerizing the polymerizable liquid crystal compound to obtain the optically anisotropic layer.

[5.1. Liquid Crystal Composition]

The liquid crystal composition is a composition containing the polymerizable liquid crystal compound, and if necessary, an optional component. The liquid crystal compound as a component of the liquid crystal composition is a compound capable of exhibiting a liquid crystal phase when the compound is mixed in liquid crystal composition and oriented. The polymerizable liquid crystal compound is a liquid crystal compound that is capable of being polymerized in the liquid crystal composition while the liquid crystal phase is exhibited, to form a polymer in which the orientation of molecules in the liquid crystal phase is maintained. Further, a polymerizable liquid crystal compound having inverse wavelength dispersion is a polymerizable liquid crystal compound with which a polymer obtained as described above exhibits inverse wavelength dispersion.

In the following description, compounds having polymerizability that are the component of the liquid crystal composition (polymerizable liquid crystal compound, other compounds having polymerizability, etc.) may be collectively referred to simply as "polymerizable compound".

[5.1.1. Polymerizable Liquid Crystal Compound]

Examples of the polymerizable liquid crystal compound may include a liquid crystal compound having a polymerizable group, a compound capable of forming a side chain-type liquid crystal polymer, and a disc-shaped liquid crystal compound. Examples of the liquid crystal compound having a polymerizable group may include rod-like liquid crystal compounds having a polymerizing group described in literatures such as Japanese Patent Application Laid-Open Nos. Hei. 11-513360 A, 2002-030042 A, 2004-204190 A, 2005-263789 A, 2007-119415 A, and 2007-186430 A. Examples of the side chain-type liquid crystal polymer compound may include side chain-type liquid crystal polymer compounds described in literatures such as Japanese Patent Application Laid-Open No. 2003-177242 A. Examples of product name of preferred liquid crystal compound may include "LC242" available from BASF. Specific examples of the disk-shaped liquid crystal compound are described in Japanese Patent Application Laid-Open No. Hei. 8-50206 A, and literatures (C. Destrade et al., Mol. Cryst. Liq. Cryst., vol. 71, page 111(1981); Quarterly Chemical Review by the Chemical Society of Japan, No. 22, Chemistry of Liquid Crystals, Chapter 5, Section 2 of Chapter 10 (1994); B. Kohne et al., Angew. Chem. Soc. Chem. Comm., page 1794 (1985); and J. Zhang et al., J. Am. Chem. Soc., vol. 116, page 2655 (1994)). As the liquid crystal compound and the polymerizable liquid crystal compound having inverse wavelength dispersion described below, one type thereof may be solely used, and two or more types thereof may also be used in combination at any ratio.

As a part or all of the polymerizable liquid crystal compound, it is preferable to use the polymerizable liquid crystal compound having inverse wavelength dispersion. When the polymerizable liquid crystal compound having inverse wavelength dispersion is used, an optically anisotropic layer having inverse wavelength dispersion can be easily obtained.

Examples of the polymerizable liquid crystal compound having inverse wavelength dispersion may include a compound having a main chain mesogen and a side chain mesogen bonded to the main chain mesogen in the molecule. In a state where such a polymerizable liquid crystal compound having inverse wavelength dispersion is oriented, the side chain mesogen may be oriented in a direction different from that of the main chain mesogen. Therefore, the main chain mesogen and the side chain mesogen may be oriented in different directions in the optically anisotropic layer. As a result of such an orientation, the optically anisotropic layer may exhibit inverse wavelength dispersion.

Specific examples of preferable polymerizable liquid crystal compound having inverse wavelength dispersion may include a compound represented by the following formula (I). In the following description, the compound represented by the formula (I) may be appropriately referred to as "compound (I)".

mesogen. The $A^1$ group affects natures of both the main chain mesogen and the side chain mesogen.

In the compound (I), $Y^1$ to $Y^8$ are each independently a chemical single bond, —O—, —S—, —O—C(=O)—, —C(=O)—O—, —O—C(=O)—O—, —NR$^1$—C(=O)—, —C(=O)—NR$^1$—, —O—C(=O)—NR$^1$—, —NR$^1$—C(=O)—O—, —NR$^1$—C(=O)—NR$^1$—, —O—NR$^1$—, or —NR$^1$—O—.

Herein, $R^1$ is a hydrogen atom or an alkyl group of 1 to 6 carbon atoms.

Examples of the alkyl group of 1 to 6 carbon atoms of $R^1$ may include a methyl group, an ethyl group, a n-propyl group, an isopropyl group, a n-butyl group, a sec-butyl group, a t-butyl group, a n-pentyl group, and a n-hexyl group.

It is preferable that $R^1$ is a hydrogen atom or an alkyl group of 1 to 4 carbon atoms.

In the compound (I), it is preferable that $Y^1$ to $Y^8$ are each independently a chemical single bond, —O—, —O—C(=O)—, —C(=O)—O—, or —O—C(=O)—O—.

In the formula (I) mentioned above, $G^1$ and $G^2$ are each independently a divalent aliphatic group of 1 to 20 carbon atoms optionally having a substituent.

Examples of the divalent aliphatic group of 1 to 20 carbon atoms may include a divalent aliphatic group having a linear structure, such as an alkylene group of 1 to 20 carbon atoms and an alkenylene group of 2 to 20 carbon atoms; and a divalent aliphatic group, such as a cycloalkanediyl group of 3 to 20 carbon atoms, a cycloalkenediyl group of 4 to 20 carbon atoms, and a divalent alicyclic fused ring group of 10 to 30 carbon atoms.

Examples of the substituent in the divalent aliphatic group of $G^1$ and $G^2$ may include a halogen atom, such as a fluorine atom, a chlorine atom, a bromine atom, and an iodine atom; and an alkoxy group of 1 to 6 carbon atoms, such as a methoxy group, an ethoxy group, a n-propoxy group, an isopropoxy group, a n-butoxy group, a sec-butoxy group, a t-butoxy group, a n-pentyloxy group, and a n-hexyloxy group. Among these, a fluorine atom, a methoxy group, and an ethoxy group are preferable.

The aforementioned aliphatic groups may have one or more per one aliphatic group of —O—, —S—, —O—C(=O)—, —C(=O)—O—, —O—C(=O)—O—, —NR$^2$—C(=O)—, —C(=O)—NR$^2$—, —NR$^2$—, or —C(=O)— inserted therein. However, cases where two or more —O— or —S— are adjacently inserted are excluded. Herein, $R^2$ is a hydrogen atom or an alkyl group of 1 to 6 carbon atoms, which are the same as those for $R^1$. It is preferable that $R^2$ is a hydrogen atom or a methyl group. It is preferable that the group inserted into the aliphatic groups is —O—, —O—C(=O)—, —C(=O)—O—, or —C(=O)—.

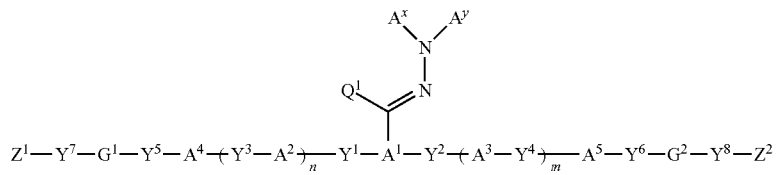

(I)

In the compound (I), a group —Y$^5$-A$^4$-(Y$^3$-A$^2$)$_n$—Y$^1$-A$^1$-Y$^2$-(A$^3$-Y$^4$)$_m$-A$^5$-Y$^6$— acts as the main mesogen, and a group >A$^1$-C(Q$^1$)=N—N(A$^x$)A$^y$ acts as the side chain Specific examples of the aliphatic groups into which the group is inserted may include —CH$_2$—CH$_2$—O—CH$_2$—CH$_2$—, —CH$_2$—CH$_2$—S—CH$_2$—CH$_2$—, —CH$_2$—CH$_2$—

O—C(=O)—CH₂—CH₂—, —CH₂—CH₂—C(=O)—O—CH₂—CH₂—, —CH₂—CH₂—C(=O)—O—CH₂—, —CH₂—O—C(=O)—O—CH₂—CH₂—, —CH₂—CH₂—NR²—C(=O)—CH₂—CH₂—, —CH₂—CH₂—C(=O)—NR²—CH₂—, —CH₂—NR²—CH₂—CH₂—, and —CH₂—C(=O)—CH₂—.

Among these, from the viewpoint of more favorably expressing the desired effect of the present invention, $G^1$ and $G^2$ are each independently preferably a divalent aliphatic group having a linear structure, such as an alkylene group of 1 to 20 carbon atoms and an alkenylene group of 2 to 20 carbon atoms, more preferably an alkylene group of 1 to 12 carbon atoms, such as a methylene group, an ethylene group, a trimethylene group, a propylene group, a tetramethylene group, a pentamethylene group, a hexamethylene group, an octamethylene group, and a decamethylene group [—(CH₂)₁₀—], and particularly preferably a tetramethylene group [—(CH₂)₄—], a hexamethylene group [—(CH₂)₆—], an octamethylene group [—(CH₂)₈—], or a decamethylene group [—(CH₂)₁₀—].

In the formula (I) mentioned above, $Z^1$ and $Z^2$ are each independently an alkenyl group of 2 to 10 carbon atoms that is unsubstituted or may be substituted by a halogen atom.

It is preferable that the number of carbon atoms in the alkenyl group is 2 to 6. Examples of the halogen atom that is a substituent in the alkenyl group of $Z^1$ and $Z^2$ may include a fluorine atom, a chlorine atom, and a bromine atom. A chlorine atom is preferable.

Specific examples of the alkenyl group of 2 to 10 carbon atoms of $Z^1$ and $Z^2$ may include CH₂=CH—, CH₂=C(CH₃)—, CH₂=CH—CH₂—, CH₃—CH=CH—, CH₂=CH—CH₂—CH₂—, CH₂=C(CH₃)—CH₂—CH₂—, (CH₃)₂C=CH—CH₂—, (CH₃)₂C=CH—CH₂—CH₂—, CH₂=C(Cl)—, CH₂=C(CH₃)—CH₂—, and CH₃—CH=CH—CH₂—.

Among these, from the viewpoint of favorably expressing the desired effect of the present invention, $Z^1$ and $Z^2$ are each independently preferably CH₂=CH—, CH₂=C(CH₃)—, CH₂=C(Cl)—, CH₂=CH—CH₂—, CH₂=C(CH₃)—CH₂—, or CH₂=C(CH₃)—CH₂—CH₂—, more preferably CH₂=CH—, CH₂=C(CH₃)— or CH₂=C(Cl)—, and particularly preferably CH₂=CH—.

In the formula (I) mentioned above, $A^x$ is an organic group of 2 to 30 carbon atoms having at least one aromatic ring selected from the group consisting of an aromatic hydrocarbon ring and an aromatic heterocyclic ring. The "aromatic ring" means a cyclic structure having aromaticity in the broad sense based on Huckel rule, that is, a cyclic conjugated structure having (4n+2) π electrons, and a cyclic structure that exhibits aromaticity by involving a lone pair of electrons of a heteroatom, such as sulfur, oxygen, and nitrogen, in a π electron system, typified by thiophene, furan, and benzothiazole.

The organic group of 2 to 30 carbon atoms having at least one aromatic ring selected from the group consisting of an aromatic hydrocarbon ring and an aromatic heterocyclic ring, of $A^x$, may have a plurality of aromatic rings, or have both an aromatic hydrocarbon ring and an aromatic heterocyclic ring.

Examples of the aromatic hydrocarbon ring may include a benzene ring, a naphthalene ring, and an anthracene ring. Examples of the aromatic heterocyclic ring may include a monocyclic aromatic heterocyclic ring, such as a pyrrole ring, a furan ring, a thiophene ring, a pyridine ring, a pyridazine ring, a pyrimidine ring, a pyrazine ring, a pyrazole ring, an imidazole ring, an oxazole ring, and a thiazole ring; and a fused aromatic heterocyclic ring, such as a benzothiazole ring, a benzoxazole ring, a quinoline ring, a phthalazine ring, a benzimidazole ring, a benzopyrazole ring, a benzofuran ring, a benzothiophene ring, a thiazolopyridine ring, an oxazolopyridine ring, a thiazolopyrazine ring, an oxazolopyrazine ring, a thiazolopyridazine ring, an oxazolopyridazine ring, a thiazolopyrimidine ring, and an oxazolopyrimidine ring.

The aromatic ring of $A^x$ may have a substituent. Examples of the substituent may include a halogen atom, such as a fluorine atom and a chlorine atom; a cyano group; an alkyl group of 1 to 6 carbon atoms, such as a methyl group, an ethyl group, and a propyl group; an alkenyl group of 2 to 6 carbon atoms, such as a vinyl group and an allyl group; a halogenated alkyl group of 1 to 6 carbon atoms, such as a trifluoromethyl group; a substituted amino group, such as a dimethylamino group; an alkoxy group of 1 to 6 carbon atoms, such as a methoxy group, an ethoxy group, and an isopropoxy group; a nitro group; an aryl group, such as a phenyl group and a naphthyl group; —C(=O)—R⁵; —C(=O)—OR⁵; and —SO₂R⁶. Herein, R⁵ is an alkyl group of 1 to 20 carbon atoms, an alkenyl group of 2 to 20 carbon atoms, or a cycloalkyl group of 3 to 12 carbon atoms. R⁶ is an alkyl group of 1 to 20 carbon atoms, an alkenyl group of 2 to 20 carbon atoms, a phenyl group, or a 4-methylphenyl group, which are the same as those for R⁴ which will be described later.

The aromatic ring of $A^x$ may have a plurality of substituents that may be the same or different, and two adjacent substituents may be bonded together to form a ring. The formed ring may be a monocycle or a fused polycycle, and may be an unsaturated ring or a saturated ring.

The "number of carbon atoms" in the organic group of 2 to 30 carbon atoms of $A^x$ means the total number of carbon atoms in the entire organic group which excludes carbon atoms in the substituents (the same applies to $A^y$ which will be described later).

Examples of the organic group of 2 to 30 carbon atoms having at least one aromatic ring selected from the group consisting of an aromatic hydrocarbon ring and an aromatic heterocyclic ring, of $A^x$, may include an aromatic hydrocarbon ring group; an aromatic heterocyclic group; an alkyl group of 3 to 30 carbon atoms having at least one aromatic ring selected from the group consisting of an aromatic hydrocarbon ring and an aromatic heterocyclic ring; an alkenyl group of 4 to 30 carbon atoms having at least one aromatic ring selected from the group consisting of an aromatic hydrocarbon ring and an aromatic heterocyclic ring; and an alkynyl group of 4 to 30 carbon atoms having at least one aromatic ring selected from the group consisting of an aromatic hydrocarbon ring and an aromatic heterocyclic ring.

Preferable specific examples of $A^x$ are as follows. However, $A^x$ is not limited to the following examples. In the following formulae, "-" represents an atomic bonding at any position of the ring (the same applies to the following).

(1) An Aromatic Hydrocarbon Ring Group

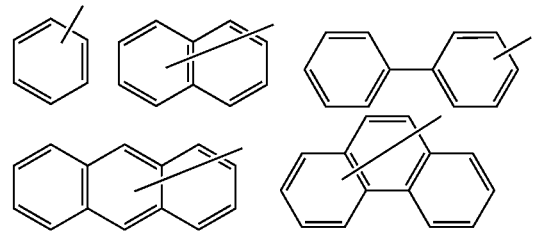

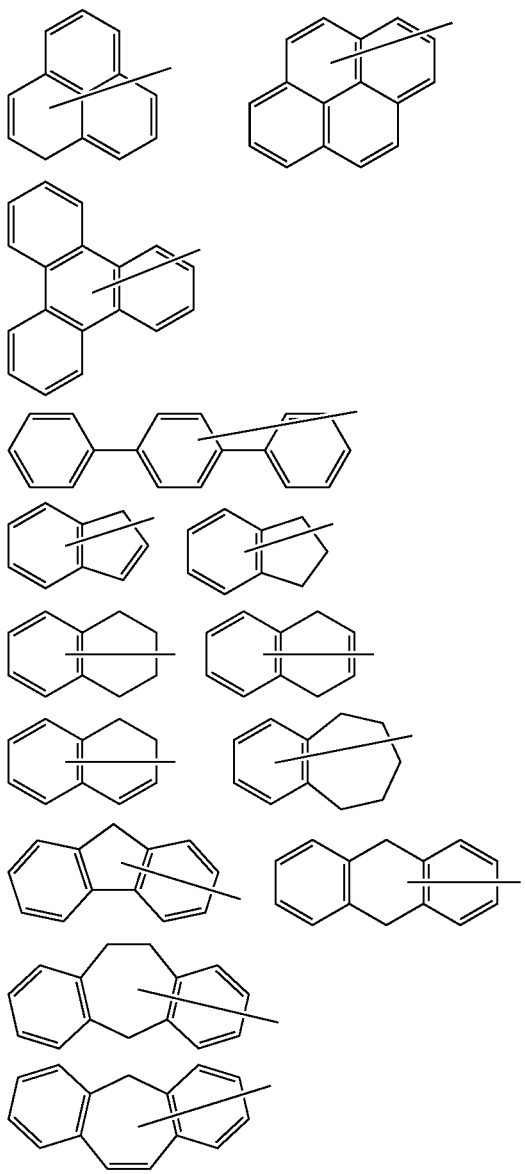

(2) An Aromatic Heterocyclic Group

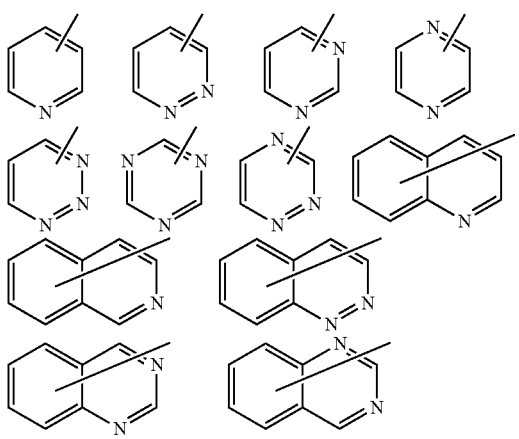

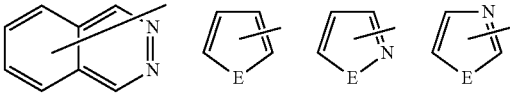

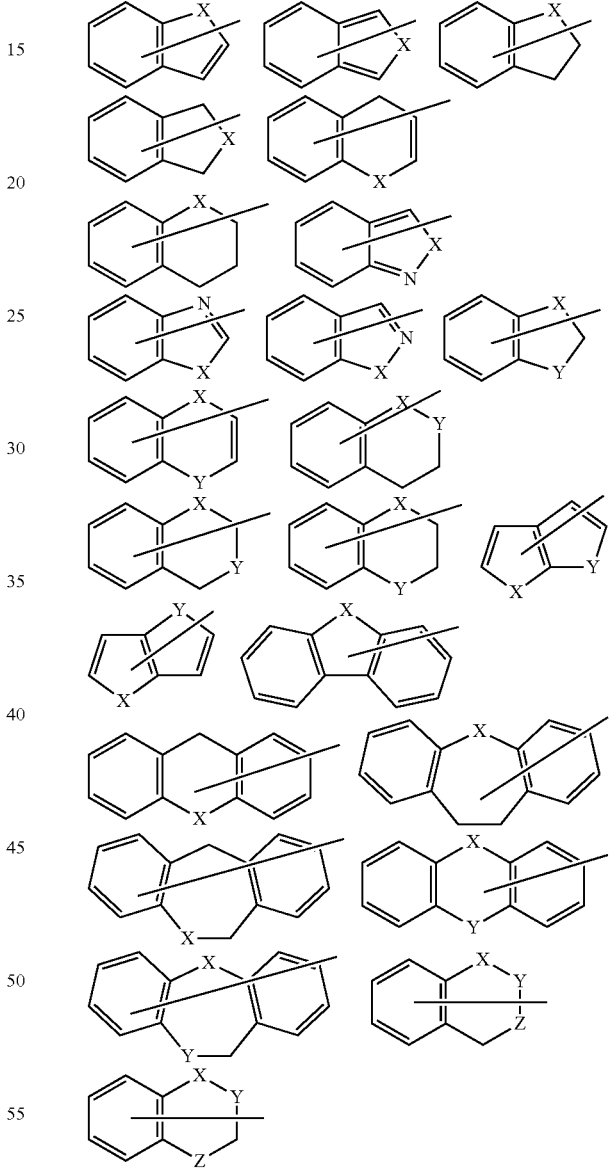

In the aforementioned formulae, E is $NR^{6a}$, an oxygen atom, or a sulfur atom. Herein, $R^{6a}$ is a hydrogen atom; or an alkyl group of 1 to 6 carbon atoms, such as a methyl group, an ethyl group, and a propyl group.

In the aforementioned formulae, X, Y, and Z are each independently $NR^7$, an oxygen atom, a sulfur atom, —SO—, or —$SO_2$— (provided that cases where an oxygen atom, a sulfur atom, —SO—, and —$SO_2$— are each adjacent are excluded). $R^7$ is a hydrogen atom, or an alkyl group of 1 to 6 carbon atoms, such as a methyl group, an ethyl group, and a propyl group, which are the same as those for $R^{6a}$ described above.

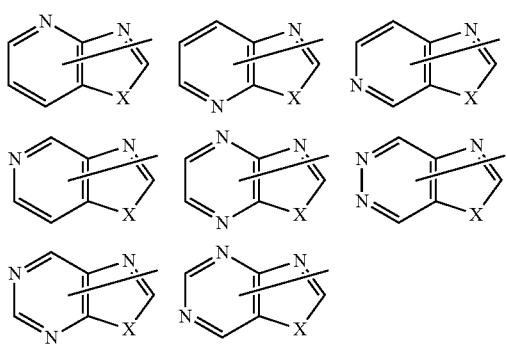

(In the aforementioned formulae, X has the same meanings as described above.)

(3) An alkyl group having at least one aromatic ring selected from the group consisting of an aromatic hydrocarbon ring and an aromatic heterocyclic ring

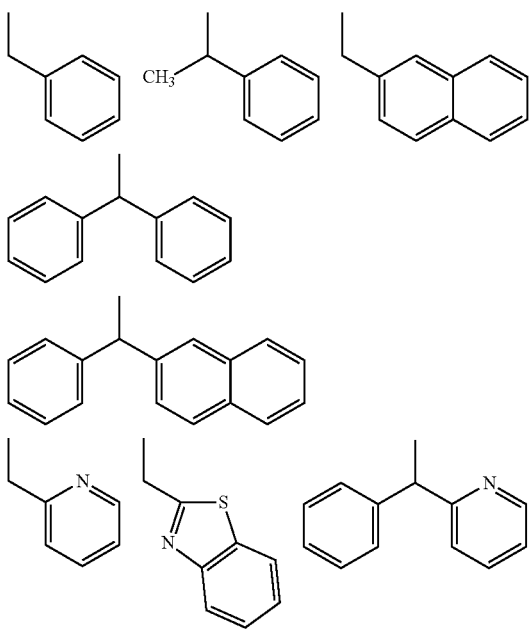

(4) An alkenyl group having at least one aromatic ring selected from the group consisting of an aromatic hydrocarbon ring and an aromatic heterocyclic ring

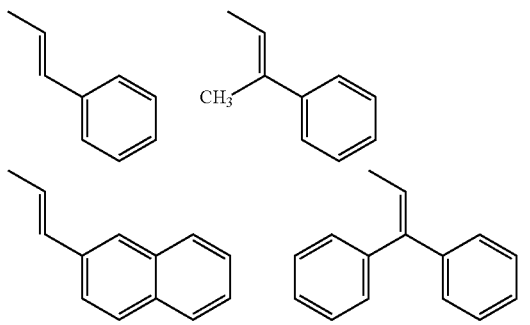

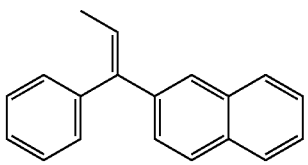

(5) An alkynyl group having at least one aromatic ring selected from the group consisting of an aromatic hydrocarbon ring and an aromatic heterocyclic ring

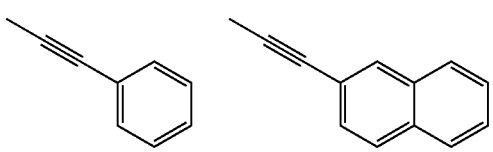

Of $A^x$ described above, an aromatic hydrocarbon ring group of 6 to 30 carbon atoms and an aromatic heterocyclic group of 4 to 30 carbon atoms are preferable, and any of the groups shown below are more preferable.

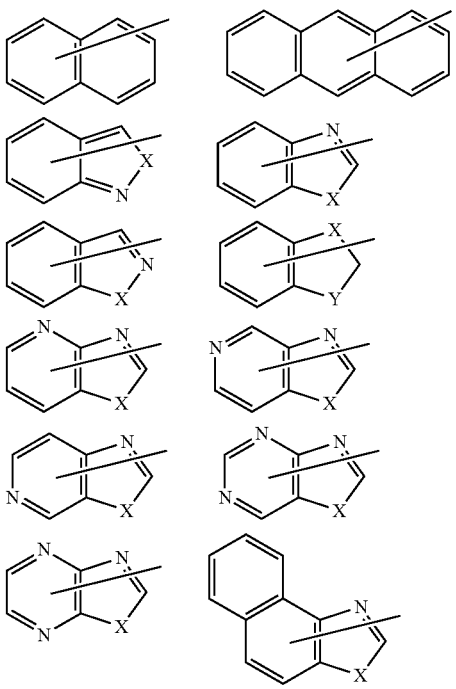

Any of the following groups are further preferable.

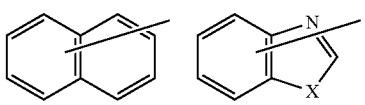

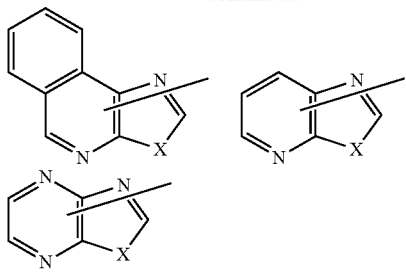

The ring that $A^x$ has may have a substituent. Examples of such a substituent may include a halogen atom, such as a fluorine atom and a chlorine atom; a cyano group; an alkyl group of 1 to 6 carbon atoms, such as a methyl group, an ethyl group, and a propyl group; an alkenyl group of 2 to 6 carbon atoms, such as a vinyl group and an allyl group; a halogenated alkyl group of 1 to 6 carbon atoms, such as a trifluoromethyl group; a substituted amino group, such as a dimethylamino group; an alkoxy group of 1 to 6 carbon atoms, such as a methoxy group, an ethoxy group, and an isopropoxy group; a nitro group; an aryl group, such as a phenyl group and a naphthyl group; —C(=O)—R$^8$; —C(=O)—OR$^8$; and —SO$_2$R$^6$. Herein, R$^8$ is an alkyl group of 1 to 6 carbon atoms, such as a methyl group and an ethyl group; or an aryl group of 6 to 14 carbon atoms, such as a phenyl group. In particular, a halogen atom, a cyano group, an alkyl group of 1 to 6 carbon atoms, or an alkoxy group of 1 to 6 carbon atoms is preferable.

The ring that $A^x$ has may have a plurality of substituents that may be the same or different, and two adjacent substituents may be bonded together to form a ring. The formed ring may be a monocycle or a fused polycycle. The "number of carbon atoms" in the organic group of 2 to 30 carbon atoms of $A^x$ means the total number of carbon atoms in the entire organic group which excludes carbon atoms in the substituents (the same applies to $A^y$ which will be described later).

In the aforementioned formula (I), $A^y$ is a hydrogen atom, an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, an alkynyl group of 2 to 20 carbon atoms optionally having a substituent, —C(=O)—R$^3$, —SO$_2$—R$^4$, —C(=S)NH—R$^9$, or an organic group of 2 to 30 carbon atoms having at least one aromatic ring selected from the group consisting of an aromatic hydrocarbon ring and an aromatic heterocyclic ring. Herein, R$^3$ is an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic hydrocarbon ring group of 5 to 12 carbon atoms. R$^4$ is an alkyl group of 1 to 20 carbon atoms, an alkenyl group of 2 to 20 carbon atoms, a phenyl group, or a 4-methylphenyl group. R$^9$ is an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic group of 5 to 20 carbon atoms optionally having a substituent.

Examples of the alkyl group of 1 to 20 carbon atoms in the alkyl group of 1 to 20 carbon atoms optionally having a substituent, of $A^y$, may include a methyl group, an ethyl group, a n-propyl group, an isopropyl group, a n-butyl group, an isobutyl group, a 1-methylpentyl group, a 1-ethylpentyl group, a sec-butyl group, a t-butyl group, a n-pentyl group, an isopentyl group, a neopentyl group, a n-hexyl group, an isohexyl group, a n-heptyl group, a n-octyl group, a n-nonyl group, a n-decyl group, a n-undecyl group, a n-dodecyl group, a n-tridecyl group, a n-tetradecyl group, a n-pentadecyl group, a n-hexadecyl group, a n-heptadecyl group, a n-octadecyl group, a n-nonadecyl group, and a n-icosyl group. The number of carbon atoms in the alkyl group of 1 to 20 carbon atoms optionally having a substituent is preferably 1 to 12, and further preferably 4 to 10.

Examples of the alkenyl group of 2 to 20 carbon atoms in the alkenyl group of 2 to 20 carbon atoms optionally having a substituent, of $A^y$, may include a vinyl group, a propenyl group, an isopropenyl group, a butenyl group, an isobutenyl group, a pentenyl group, a hexenyl group, a heptenyl group, an octenyl group, a decenyl group, an undecenyl group, a dodecenyl group, a tridecenyl group, a tetradecenyl group, a pentadecenyl group, a hexadecenyl group, a heptadecenyl group, an octadecenyl group, a nonadecenyl group, and an icocenyl group. The number of carbon atoms in the alkenyl group of 2 to 20 carbon atoms optionally having a substituent is preferably 2 to 12.

Examples of the cycloalkyl group of 3 to 12 carbon atoms in the cycloalkyl group of 3 to 12 carbon atoms optionally having a substituent, of $A^y$, may include a cyclopropyl group, a cyclobutyl group, a cyclopentyl group, a cyclohexyl group, and a cyclooctyl group.

Examples of the alkynyl group of 2 to 20 carbon atoms in the alkynyl group of 2 to 20 carbon atoms optionally having a substituent, of $A^y$, may include an ethynyl group, a propynyl group, a 2-propynyl group (propargyl group), a butynyl group, a 2-butynyl group, a 3-butynyl group, a pentynyl group, a 2-pentynyl group, a hexynyl group, a 5-hexynyl group, a heptynyl group, an octynyl group, a 2-octynyl group, a nonanyl group, a decanyl group, and a 7-decanyl group.

Examples of the substituents in the alkyl group of 1 to 20 carbon atoms optionally having a substituent and the alkenyl group of 2 to 20 carbon atoms optionally having a substituent, of $A^y$, may include a halogen atom, such as a fluorine atom and a chlorine atom; a cyano group; a substituted amino group, such as a dimethylamino group; an alkoxy group of 1 to 20 carbon atoms, such as a methoxy group, an ethoxy group, an isopropyl group, and a butoxy group; an alkoxy group of 1 to 12 carbon atoms that is substituted by an alkoxy group of 1 to 12 carbon atoms, such as a methoxymethoxy group and a methoxyethoxy group; a nitro group; an aryl group, such as a phenyl group and a naphthyl group; a cycloalkyl group of 3 to 8 carbon atoms, such as a cyclopropyl group, a cyclopentyl group, and a cyclohexyl group; a cycloalkyloxy group of 3 to 8 carbon atoms, such as a cyclopentyloxy group, and a cyclohexyloxy group; a cyclic ether group of 2 to 12 carbon atoms, such as a tetrahydrofuranyl group, a tetrahydropyranyl group, a dioxolanyl group, and a dioxanyl group; an aryloxy group of 6 to 14 carbon atoms, such as a phenoxy group, and a naphthoxy group; a fluoroalkoxy group of 1 to 12 carbon atoms in which at least one is substituted by a fluoro atom, such as a trifluoromethyl group, a pentafluoroethyl group, and —CH$_2$CF$_3$; a benzofuryl group; a benzopyranyl group; a benzodioxolyl group; a benzodioxanyl group; —C(=O)—R$^{7a}$; —C(=O)—OR$^{7a}$; —SO$_2$R$^{8a}$; —SR$^{10}$; an alkoxy group of 1 to 12 carbon atoms substituted by —SR$^{10}$; and a hydroxyl group. Herein, R$^{7a}$ and R$^{10}$ are each independently an alkyl group of 1 to 20 carbon atoms, an alkenyl group of 2 to 20 carbon atoms, a cycloalkyl group of 3 to 12 carbon atoms, or an aromatic hydrocarbon ring group of 6 to 12 carbon atoms. R$^{8a}$ is an alkyl group of 1 to 20 carbon atoms, an alkenyl group of 2 to 20 carbon atoms, a phenyl group, or a 4-methylphenyl group, which are the same as those for R$^4$ described above.

Examples of the substituent in the cycloalkyl group of 3 to 12 carbon atoms optionally having a substituent, of $A^y$, may include a halogen atom, such as a fluorine atom and a chlorine atom; a cyano group; a substituted amino group, such as a dimethylamino group; an alkyl group of 1 to 6 carbon atoms, such as a methyl group, an ethyl group, and a propyl group; an alkoxy group of 1 to 6 carbon atoms, such as a methoxy group, an ethoxy group, and an isopropoxy group; a nitro group; an aryl group, such as a phenyl group and a naphthyl group; a cycloalkyl group of 3 to 8 carbon atoms, such as a cyclopropyl group, a cyclopentyl group, and a cyclohexyl group; —C(=O)—R$^{7a}$; —C(=O)—OR$^{7a}$; —SO$_2$R$^{8a}$; and a hydroxyl group. Herein, R$^{7a}$ and R$^{8a}$ have the same meanings as described above.

Examples of the substituent in the alkynyl group of 2 to 20 carbon atoms optionally having a substituent, of A$^y$, may include substituents that are the same as the substituents in the alkyl group of 1 to 20 carbon atoms optionally having a substituent and the alkenyl group of 2 to 20 carbon atoms optionally having a substituent.

In the group represented by —C(=O)—R$^3$ of A$^y$, R$^3$ is an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic hydrocarbon ring group of 5 to 12 carbon atoms. Specific examples thereof may include those exemplified as the examples of the alkyl group of 1 to 20 carbon atoms optionally having a substituent, the alkenyl group of 2 to 20 carbon atoms optionally having a substituent, and the cycloalkyl group of 3 to 12 carbon atoms optionally having a substituent, of A$^y$; and the aromatic hydrocarbon ring group of 5 to 12 carbon atoms, among the aromatic hydrocarbon ring groups described in A$^x$ described above.

In the group represented by —SO$_2$—R$^4$ of A$^y$, R$^4$ is an alkyl group of 1 to 20 carbon atoms, an alkenyl group of 2 to 20 carbon atoms, a phenyl group, or a 4-methylphenyl group. Specific examples of the alkyl group of 1 to 20 carbon atoms and the alkenyl group of 2 to 20 carbon atoms, of R$^4$, may include those exemplified as the examples of the alkyl group of 1 to 20 carbon atoms, and the alkenyl group of 2 to 20 carbon atoms, of A$^y$ described above.

In the group represented by —C(=S)NH—R$^9$ of A$^y$, R$^9$ is an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic group of 5 to 20 carbon atoms optionally having a substituent. Specific examples thereof may include those exemplified as the examples of the alkyl group of 1 to 20 carbon atoms optionally having a substituent, the alkenyl group of 2 to 20 carbon atoms optionally having a substituent, and the cycloalkyl group of 3 to 12 carbon atoms optionally having a substituent, of A$^y$ described above; and the aromatic hydrocarbon ring group of 5 to 20 carbon atoms and aromatic heteroaromatic ring group of 5 to 20 carbon atoms, among the aromatic hydrocarbon ring groups and aromatic heteroaromatic ring groups described in A$^x$ described above.

Examples of the organic group of 2 to 30 carbon atoms having at least one aromatic ring selected from the group consisting of an aromatic hydrocarbon ring and an aromatic heterocyclic ring of A$^y$ may include those exemplified as the examples of A$^x$ described above.

Among these, A$^y$ is preferably a hydrogen atom, an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, an alkynyl group of 2 to 20 carbon atoms optionally having a substituent, —C(=O)—R$^3$, —SO$_2$—R$^4$, or an organic group of 2 to 30 carbon atoms having at least one aromatic ring selected from the group consisting of an aromatic hydrocarbon ring and an aromatic heterocyclic ring, and further preferably a hydrogen atom, an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, an alkynyl group of 2 to 20 carbon atoms optionally having a substituent, an aromatic hydrocarbon ring group of 6 to 12 carbon atoms optionally having a substituent, an aromatic heterocyclic group of 3 to 9 carbon atoms optionally having a substituent, or a group represented by —C(=O)—R$^3$ or —SO$_2$—R$^4$. Herein, R$^3$ and R$^4$ have the same meanings as described above.

It is preferable that substituents in the alkyl group of 1 to 20 carbon atoms optionally having a substituent, the alkenyl group of 2 to 20 carbon atoms optionally having a substituent, and the alkynyl group of 2 to 20 carbon atoms optionally having a substituent, of A$^y$, are a halogen atom, a cyano group, an alkoxy group of 1 to 20 carbon atoms, an alkoxy group of 1 to 12 carbon atoms that is substituted by an alkoxy group of 1 to 12 carbon atoms, a phenyl group, a cyclohexyl group, a cyclic ether group of 2 to 12 carbon atoms, an aryloxy group of 6 to 14 carbon atoms, a hydroxyl group, a benzodioxanyl group, a phenylsulfonyl group, a 4-methylphenylsulfonyl group, a benzoyl group, or —SR$^{10}$. Herein, R$^{10}$ has the same meanings as described above.

It is preferable that substituents in the cycloalkyl group of 3 to 12 carbon atoms optionally having a substituent, the aromatic hydrocarbon ring group of 6 to 12 carbon atoms optionally having a substituent, and the aromatic heterocyclic group of 3 to 9 carbon atoms optionally having a substituent, of A$^y$, are a fluorine atom, an alkyl group of 1 to 6 carbon atoms, an alkoxy group of 1 to 6 carbon atoms, or a cyano group.

A$^x$ and A$^y$ may form a ring together. Examples of the ring may include an unsaturated heterocyclic ring of 4 to 30 carbon atoms optionally having a substituent and an unsaturated carbon ring of 6 to 30 carbon atoms optionally having a substituent. The aforementioned unsaturated heterocyclic ring of 4 to 30 carbon atoms and the aforementioned unsaturated carbon ring of 6 to 30 carbon atoms are not particularly restricted, and may or may not have aromaticity.

Examples of the ring formed by A$^x$ and A$^y$ together may include rings shown below. The rings shown below are a moiety of:

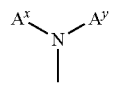

in the formula (I).

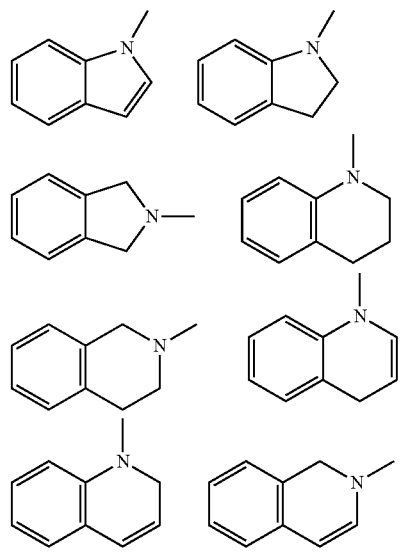

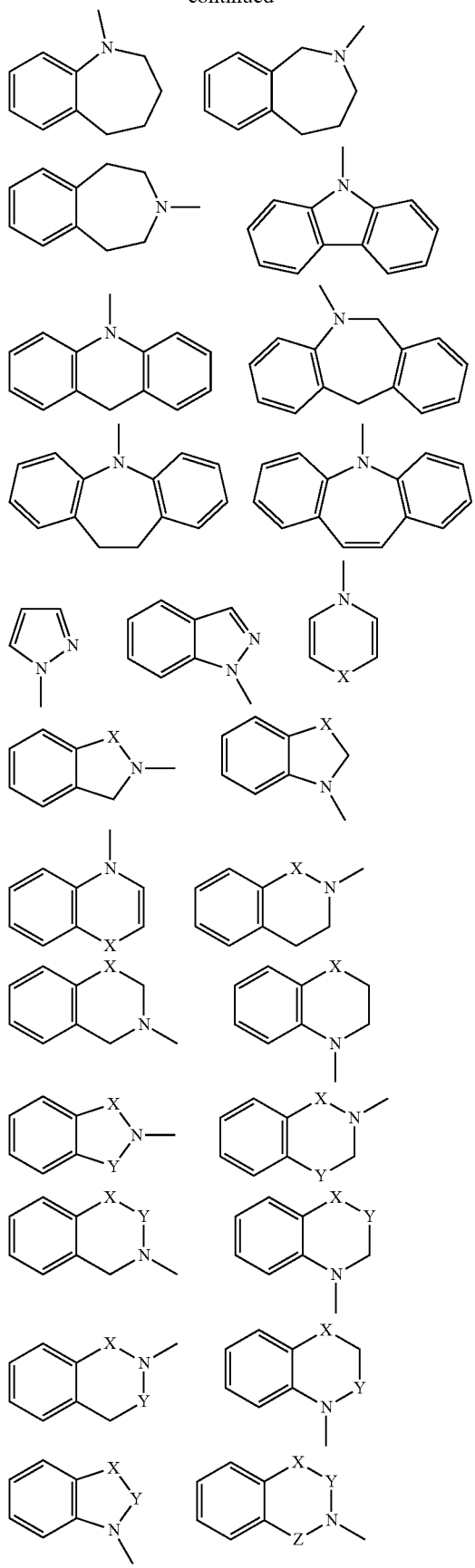
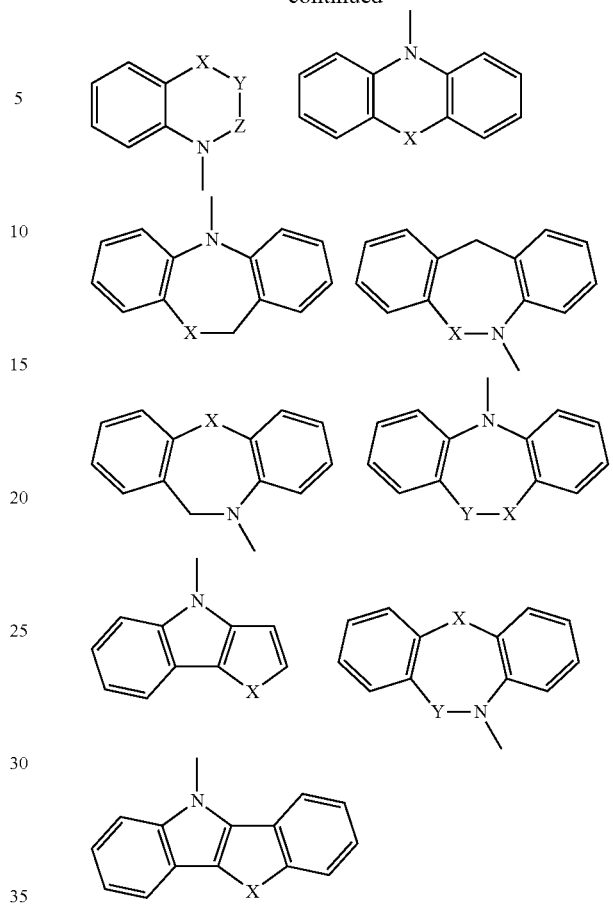

(In the formulae, X, Y, and Z have the same meanings as described above.)

The rings may have a substituent. Examples of the substituent may include those enumerated as the substituent on the aromatic ring of $A^x$.

The total number of π electrons contained in $A^x$ and $A^y$ is preferably 4 or more and 24 or less, more preferably 6 or more and 20 or less, and further preferably 6 or more and 18 or less from the viewpoint of favorably expressing the desired effect of the present invention.

Examples of preferred combination of $A^x$ and $A^y$ may include the following combinations (α) and (β).

(α) a combination of $A^x$ and $A^y$ in which $A^x$ is an aromatic hydrocarbon ring group of 4 to 30 carbon atoms or an aromatic heterocyclic group of 4 to 30 carbon atoms, $A^y$ is a hydrogen atom, a cycloalkyl group of 3 to 8 carbon atoms, an aromatic hydrocarbon ring group of 6 to 12 carbon atoms optionally having a substituent (a halogen atom, a cyano group, an alkyl group of 1 to 6 carbon atoms, an alkoxy group of 1 to 6 carbon atoms, or a cycloalkyl group of 3 to 8 carbon atoms), an aromatic heterocyclic group of 3 to 9 carbon atoms optionally having a substituent (a halogen atom, an alkyl group of 1 to 6 carbon atoms, an alkoxy group of 1 to 6 carbon atoms, or a cyano group), an alkyl group of 1 to 20 carbon atoms optionally having a substituent, an alkenyl group of 1 to 20 carbon atoms optionally having a substituent, or an alkynyl group of 2 to 20 carbon atoms optionally having a substituent, and the substituent is any of a halogen atom, a cyano group, an alkoxy group of 1 to 20 carbon atoms, an alkoxy group of 1 to 12 carbon atoms that is substituted by an alkoxy group of 1 to 12 carbon atoms, a phenyl group, a cyclohexyl group, a cyclic ether group of 2 to 12 carbon atoms, an aryloxy group of 6 to 14 carbon atoms, a hydroxyl group, a benzodioxanyl group, a benzenesulfonyl group, a benzoyl group, and —$SR^{10}$.

(β) a combination of $A^x$ and $A^y$ in which $A^x$ and $A^y$ together form an unsaturated heterocyclic ring or an unsaturated carbon ring. Herein, $R^{10}$ has the same meanings as described above.

Examples of more preferred combination of $A^x$ and $A^y$ may include the following combination (γ).

(γ) a combination of $A^x$ and $A^y$ in which $A^x$ is any of groups having the following structures, $A^y$ is a hydrogen atom, a cycloalkyl group of 3 to 8 carbon atoms, an aromatic hydrocarbon ring group of 6 to 12 carbon atoms optionally having a substituent (a halogen atom, a cyano group, an alkyl group of 1 to 6 carbon atoms, an alkoxy group of 1 to 6 carbon atoms, or a cycloalkyl group of 3 to 8 carbon atoms), an aromatic heterocyclic group of 3 to 9 carbon atoms optionally having a substituent (a halogen atom, an alkyl group of 1 to 6 carbon atoms, an alkoxy group of 1 to 6 carbon atoms, or a cyano group), an alkyl group of 1 to 20 carbon atoms optionally having a substituent, an alkenyl group of 1 to 20 carbon atoms optionally having a substituent, or an alkynyl group of 2 to 20 carbon atoms optionally having a substituent, and the substituent is any of a halogen atom, a cyano group, an alkoxy group of 1 to 20 carbon atoms, an alkoxy group of 1 to 12 carbon atoms that is substituted by an alkoxy group of 1 to 12 carbon atoms, a phenyl group, a cyclohexyl group, a cyclic ether group of 2 to 12 carbon atoms, an aryloxy group of 6 to 14 carbon atoms, a hydroxyl group, a benzodioxanyl group, a benzenesulfonyl group, a benzoyl group, and —$SR^{10}$. Herein, $R^{10}$ has the same meanings as described above.

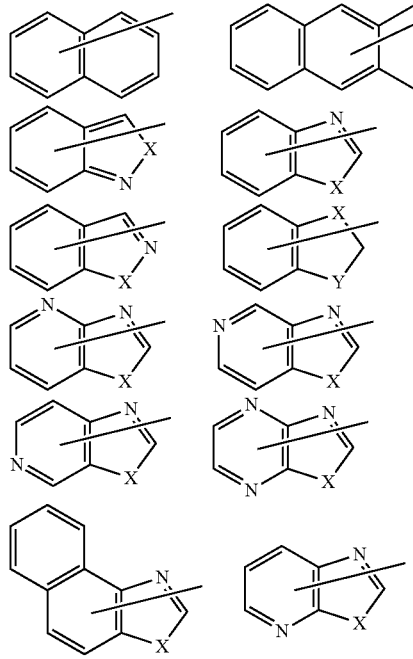

(In the formulae, X and Y have the same meanings as described above.)

Examples of particularly preferred combination of Ax and $A^y$ may include the following combination (δ).

(δ) a combination of $A^x$ and $A^y$ in which $A^x$ is any of groups having the following structures, $A^y$ is a hydrogen atom, a cycloalkyl group of 3 to 8 carbon atoms, an aromatic hydrocarbon ring group of 6 to 12 carbon atoms optionally having a substituent (a halogen atom, a cyano group, an alkyl group of 1 to 6 carbon atoms, an alkoxy group of 1 to 6 carbon atoms, or a cycloalkyl group of 3 to 8 carbon atoms), an aromatic heterocyclic group of 3 to 9 carbon atoms optionally having a substituent (a halogen atom, an alkyl group of 1 to 6 carbon atoms, an alkoxy group of 1 to 6 carbon atoms, or a cyano group), an alkyl group of 1 to 20 carbon atoms optionally having a substituent, an alkenyl group of 1 to 20 carbon atoms optionally having a substituent, or an alkynyl group of 2 to 20 carbon atoms optionally having a substituent, and the substituent is any of a halogen atom, a cyano group, an alkoxy group of 1 to 20 carbon atoms, an alkoxy group of 1 to 12 carbon atoms that is substituted by an alkoxy group of 1 to 12 carbon atoms, a phenyl group, a cyclohexyl group, a cyclic ether group of 2 to 12 carbon atoms, an aryloxy group of 6 to 14 carbon atoms, a hydroxyl group, a benzodioxanyl group, a benzenesulfonyl group, a benzoyl group, and —$SR^{10}$. In the following formulae, X has the same meanings as described above. Herein, $R^{10}$ has the same meanings as described above.

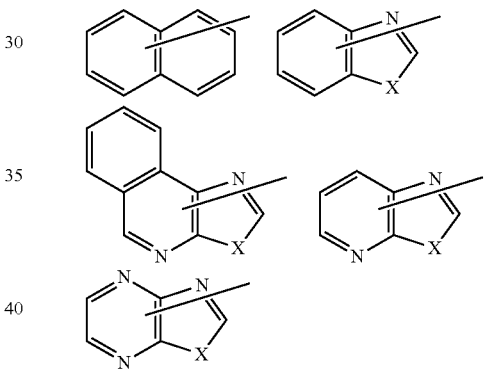

In the formula (I) mentioned above, $A^1$ is a trivalent aromatic group optionally having a substituent. The trivalent aromatic group may be a trivalent carbocyclic aromatic group or a trivalent heterocyclic aromatic group. From the viewpoint of favorably expressing the desired effect of the present invention, the trivalent aromatic group is preferably the trivalent carbocyclic aromatic group, more preferably a trivalent benzene ring group or a trivalent naphthalene ring group, and further preferably a trivalent benzene ring group or a trivalent naphthalene ring group that is represented by the following formula. In the following formulae, substituents $Y^1$ and $Y^2$ are illustrated for the sake of convenience to clearly show a bonding state ($Y^1$ and $Y^2$ have the same meanings as described above, and the same applies to the following).

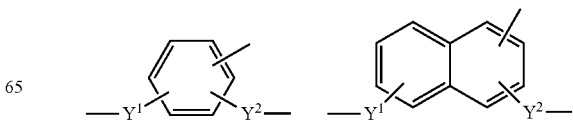

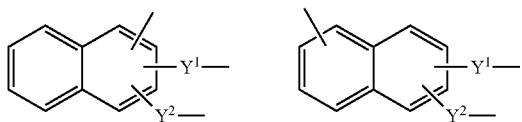

Among these, $A^1$ is more preferably a group represented by each of the following formulae (A11) to (A25), further preferably a group represented by the formula (A11), (A13), (A15), (A19), or (A23), and particularly preferably a group represented by the formula (A11) or (A23).

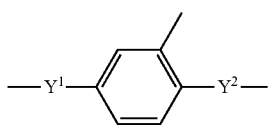
(A11)

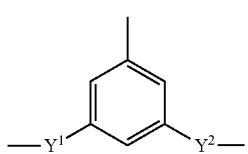
(A12)

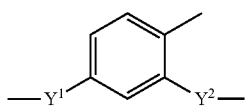
(A13)

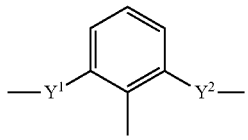
(A14)

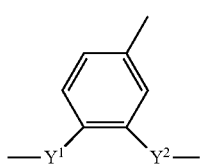
(A15)

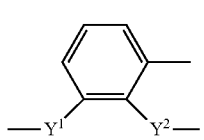
(A16)

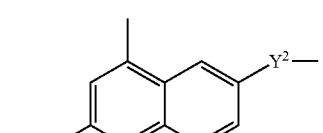
(A17)

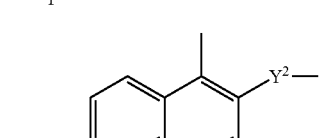
(A18)

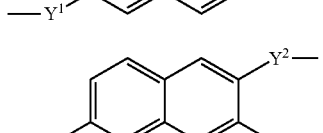
(A19)

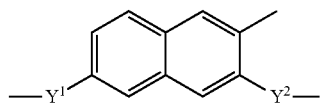
(A20)

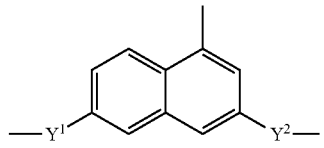
(A21)

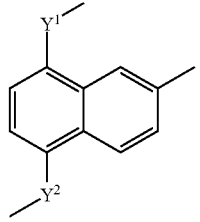
(A22)

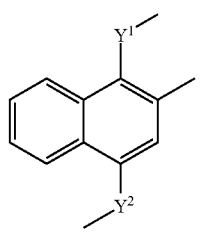
(A23)

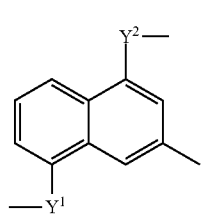
(A24)

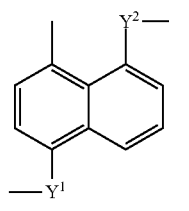
(A25)

Examples of the substituent that may be included in the trivalent aromatic group of $A^1$ may include those enumerated as the substituent in the aromatic ring of $A^x$ described above. It is preferable that $A^1$ is a trivalent aromatic group having no substituent.

In the formula (I) mentioned above, $A^2$ and $A^3$ are each independently a divalent alicyclic hydrocarbon group of 3 to 30 carbon atoms optionally having a substituent. Examples of the divalent alicyclic hydrocarbon group of 3 to 30 carbon atoms may include a cycloalkanediyl group of 3 to 30 carbon atoms, and a divalent alicyclic fused ring group of 10 to 30 carbon atoms.

Examples of the cycloalkanediyl group of 3 to 30 carbon atoms may include a cyclopropanediyl group; a cyclobutanediyl group, such as a cyclobutane-1,2-diyl group and a cyclobutane-1,3-diyl group; a cyclopentanediyl group, such as a cyclopentane-1,2-diyl group and a cyclopentane-1,3-diyl group; a cyclohexanediyl group, such as a cyclohexane-1,2-diyl group, a cyclohexane-1,3-diyl group, and a cyclohexane-1,4-diyl group; a cycloheptanediyl group, such as a cycloheptane-1,2-diyl group, a cycloheptane-1,3-diyl group, and a cycloheptane-1,4-diyl group; a cyclooctanediyl group, such as a cyclooctane-1,2-diyl group, a cyclooctane-1,3-diyl group, a cyclooctane-1,4-diyl group, and a cyclooctane-1,5-diyl group; a cyclodecanediyl group, such as a cyclodecane-1,2-diyl group, a cyclodecane-1,3-diyl group, a cyclodecane-1,4-diyl group, and a cyclodecane-1,5-diyl group; a cyclododecanediyl group, such as a cyclododecane-1,2-diyl group, a cyclododecane-1,3-diyl group, a cyclododecane-1,4-diyl group, and a cyclododecane-1,5-diyl group; a cyclotetradecanediyl group, such as a cyclotetradecane-1,2-diyl group, a cyclotetradecane-1,3-diyl group, a cyclotetradecane-1,4-diyl group, a cyclotetradecane-1,5-diyl group, and a cyclotetradecane-1,7-diyl group; and a cycloeicosanediyl group, such as a cycloeicosane-1,2-diyl group and a cycloeicosane-1,10-diyl group.

Examples of the divalent alicyclic fused ring group of 10 to 30 carbon atoms may include a decalindiyl group, such as a decalin-2,5-diyl group and a decalin-2,7-diyl group; an adamantanediyl group, such as an adamantane-1,2-diyl group and an adamantane-1,3-diyl group; and a bicyclo[2.2.1]heptanediyl group, such as a bicyclo[2.2.1]heptane-2,3-diyl group, a bicyclo[2.2.1]heptane-2,5-diyl group, and a bicyclo[2.2.1]heptane-2,6-diyl group.

The divalent alicyclic hydrocarbon groups may further have a substituent at any position. Examples of the substituent may include those enumerated as the substituent in the aromatic ring of $A^x$ described above.

Among these, $A^2$ and $A^3$ are preferably a divalent alicyclic hydrocarbon group of 3 to 12 carbon atoms, more preferably a cycloalkanediyl group of 3 to 12 carbon atoms, further preferably a group represented by each of the following formulae (A31) to (A34), and particularly preferably the group represented by the following formula (A32).

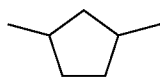
(A31)

(A32)

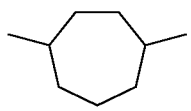
(A33)

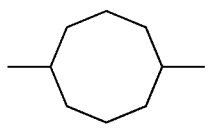
(A34)

The divalent alicyclic hydrocarbon group of 3 to 30 carbon atoms may exist in forms of cis- and trans-stereoisomers that are on the basis of difference of stereoconfiguration of carbon atoms bonded to $Y^1$ and $Y^3$ (or $y^2$ and $Y^4$). For example, when the group is a cyclohexane-1,4-diyl group, a cis-isomer (A32a) and a trans-isomer (A32b) may exist, as described below.

(A32a)

(A32b)

The aforementioned divalent alicyclic hydrocarbon group of 3 to 30 carbon atoms may be a cis-isomer, a trans-isomer, or an isomeric mixture of cis- and trans-isomers. Since the orientation is favorable, the group is preferably the trans-isomer or the cis-isomer, and more preferably the trans-isomer.

In the formula (I) mentioned above, $A^4$ and $A^5$ are each independently a divalent aromatic group of 6 to 30 carbon atoms optionally having a substituent. The aromatic group of $A^4$ and $A^5$ may be monocyclic or polycyclic. Specific preferable examples of $A^4$ and $A^5$ are as follows.

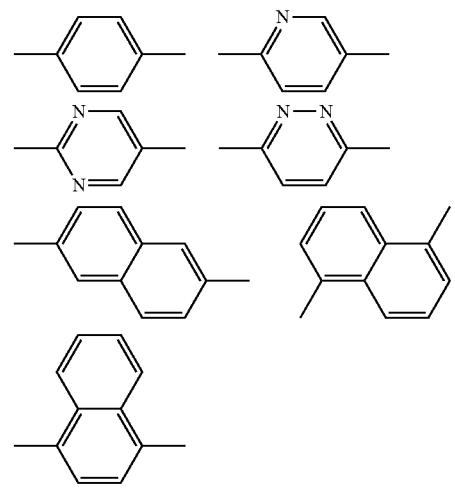

The divalent aromatic groups of $A^4$ and $A^5$ described above may have a substituent at any position. Examples of the substituent may include a halogen atom, a cyano group, a hydroxyl group, an alkyl group of 1 to 6 carbon atoms, an alkoxy group of 1 to 6 carbon atoms, a nitro group, and a —C(=O)—OR$^{8b}$ group. Herein, R$^{8b}$ is an alkyl group of 1 to 6 carbon atoms. In particular, it is preferable that the substituent is a halogen atom, an alkyl group of 1 to 6 carbon atoms, or an alkoxy group. Of the halogen atoms, a fluorine atom is more preferable, of the alkyl groups of 1 to 6 carbon atoms, a methyl group, an ethyl group, and a propyl group are more preferable, and of the alkoxy groups, a methoxy group and an ethoxy group are more preferable.

Among these, from the viewpoint of favorably expressing the desired effect of the present invention, $A^4$ and $A^5$ are each independently preferably a group represented by the following formula (A41), (A42), or (A43) and optionally having a substituent, and particularly preferably the group represented by the formula (A41) and optionally having a substituent.

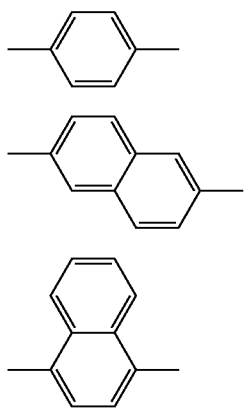

(A41)

(A42)

(A43)

In the formula (I) mentioned above, $Q^1$ is a hydrogen atom or an alkyl group of 1 to 6 carbon atoms optionally having a substituent. Examples of the alkyl group of 1 to 6 carbon atoms optionally having a substituent may include the alkyl group of 1 to 6 carbon atoms among the alkyl groups of 1 to 20 carbon atoms optionally having a substituent that are described regarding $A^y$ described above. Among these, $Q^1$ is preferably a hydrogen atom or an alkyl group of 1 to 6 carbon atoms, and more preferably a hydrogen atom or a methyl group.

In the formula (I) mentioned above, m and n are each independently 0 or 1. Among these, m is preferably 1, and n is preferably 1.

The compound (I) may be produced by, for example, a reaction of a hydrazine compound with a carbonyl compound, described in International publication No. WO2012/147904.

[5.1.2. Polymerizable Monomer]

The liquid crystal composition may contain a polymerizable monomer as an optional component. The "polymerizable monomer" represents, among compounds that have polymerization ability and is capable of acting as a monomer, in particular, a compound other than the polymerizable liquid crystal compound.

As the polymerizable monomer, for example, a compound having one or more polymerizable groups per molecule may be used. When the polymerizable monomer has such a polymerizable group, polymerization can be achieved in formation of the optically anisotropic layer. When the polymerizable monomer is a crosslinkable monomer having two or more polymerizable groups per molecule, a cross-linking polymerization can be achieved. Examples of the polymerizable groups may include groups that are the same as the groups of $Z^1$—$Y^7$— and $Z^2$—$Y^8$— in the compound (I). Specific examples of the polymerizable groups may include an acryloyl group, a methacryloyl group, and an epoxy group.

The polymerizable monomer itself may have non-liquid crystallizability. Herein, the polymerizable monomer itself that has "non-liquid crystallizability" means that even when the polymerizable monomer itself is left at any temperature of room temperature to 200° C., the monomer does not exhibit orientation on the first substrate that has been subjected to an orientation treatment. The presence or absence of orientation is determined by presence or absence of light-dark contrast when a sample is rotated in an in-plane direction during crossed nicol transmission observation by a polarized light microscope.

The amount ratio of the polymerizable monomer to be mixed in the liquid crystal composition is preferably 1 part by weight or more, and more preferably 5 parts by weight or more, and is preferably 100 parts by weight or less, and more preferably 50 parts by weight or less, relative to 100 parts by weight of the polymerizable liquid crystal compound. When the amount ratio of the polymerizable monomer to be mixed is appropriately adjusted within the aforementioned range so as to exhibit desired inverse wavelength dispersion (forward wavelength dispersion or inverse wavelength dispersion), the wavelength dispersion is easily controlled with precision.

The polymerizable monomer may be produced by a publicly known production method. When the polymerizable monomer has a structure similar to the compound (I), the polymerizable monomer may be produced in accordance with a method for producing the compound (I).

[5.1.3. Optional Component of Liquid Crystal Composition]

In addition to the polymerizable liquid crystal compound and the polymerizable monomer, the liquid crystal composition may contain an optional component such as those exemplified below, if necessary.

The liquid crystal composition may contain a polymerization initiator. The polymerization initiator may be appropriately selected depending on the type of polymerizable groups of polymerizable compound such as the polymerizable liquid crystal compound and the polymerizable monomer in the liquid crystal composition. For example, when the polymerizable group has radical polymerizability, a radical polymerization initiator may be used. When the polymerizable group is an anionic polymerizable group, an anionic polymerization initiator may be used. When the polymerizable group is a cationic polymerizable group, a cationic polymerization initiator may be used.

As the radical polymerization initiator, any of a thermal radical generator that is a compound that generates active species capable of initiating polymerization of the polymerizable compound by heating; and a photo-radical generator that is a compound that generates active species capable of initiating polymerization of the polymerizable compound by exposure to exposure light such as visible light, ultraviolet light (i-line, etc.), far-ultraviolet light, an electron beam, and an X-ray may be used. The photo-radical generator is suitably used.

Examples of the photo-radical generator may include an acetophenone-based compound, a biimidazole-based compound, a triazine-based compound, an O-acyl oxime-based compound, an onium salt-based compound, a benzoin-based compound, a benzophenone-based compound, an α-diketone-based compound, a polynuclear quinone-based compound, a xanthone-based compound, a diazo-based compound, and an imide sulfonate-based compound, which are described in International publication WO2012/147904.

Examples of the anionic polymerization initiator may include an alkyl lithium compound; a monolithium salt or a monosodium salt of biphenyl, naphthalene, and pyrene; and a polyfunctional initiator such as a dilithium salt and a trilithium salt.

Examples of the cationic polymerization initiator may include a protonic acid such as sulfuric acid, phosphoric acid, perchloric acid, and trifluoromethanesulfonic acid; a Lewis acid such as boron trifluoride, aluminum chloride, titanium tetrachloride, and tin tetrachloride; an aromatic onium salt, and a combination of an aromatic onium salt with a reducing agent.

As the polymerization initiator, one type thereof may be solely used, and two or more types thereof may also be used in combination at any ratio. The ratio of the polymerization initiator in the liquid crystal composition is preferably 0.1 parts by weight or more, and more preferably 0.5 parts by weight or more, and is preferably 30 parts by weight or less, and more preferably 10 parts by weight or less, relative to 100 parts by weight of the polymerizable compound.

The liquid crystal composition may contain a surfactant for adjusting the surface tension. The surfactant is not particularly limited, and a nonionic surfactant is usually preferable, and a nonionic surfactant that is an oligomer having a molecular weight of about several thousand is more preferable. As the nonionic surfactant, PolyFox "PF-151N", "PF-636", "PF-6320", "PF-656", "PF-6520", "PF-3320", "PF-651", or "PF-652" available from Omnova Solutions Inc.; FTERGENT "FTX-209F", "FTX-208G", or "FTX-204D" available from Neos Company Limited; Surflon "KH-40", or "S-420" available from Seimi Chemical Co., Ltd.; or the like may be used. As the surfactant, one type thereof may be solely used, and two or more types thereof may also be used in combination at any ratio. The ratio of the surfactant in the liquid crystal composition is preferably 0.01 parts by weight or more, and more preferably 0.1 parts by weight or more, and preferably 10 parts by weight or less, and more preferably 2 parts by weight or less, relative to 100 parts by weight of the polymerizable compound.

The liquid crystal composition may contain a solvent such as an organic solvent. Examples of the organic solvent may include a ketone solvent such as cyclopentanone, cyclohexanone, methyl ethyl ketone, acetone, and methyl isobutyl ketone; an acetic acid ester solvent such as butyl acetate and amyl acetate; a halogenated hydrocarbon solvent such as chloroform, dichloromethane, and dichloroethane; an ether solvent such as 1,4-dioxane, cyclopentyl methyl ether, tetrahydrofuran, tetrahydropyran, 1,3-dioxolane, and 1,2-dimethoxyethane; and an aromatic hydrocarbon such as toluene, xylene, and mesitylene. From the viewpoint of excellent handleability, the boiling point of the solvent is preferably 60° C. to 250° C., and more preferably 60° C. to 150° C. The amount of the solvent is preferably 100 parts by weight to 1,000 parts by weight relative to 100 parts by weight of the polymerizable compound.

The liquid crystal composition may further contain an optional additive such as a metal; a metal complex; a colorant such as a dye and a pigment; a light-emitting material such as a fluorescent material and a phosphorescent material; a leveling agent; a thixotropic agent; a gelator; a polysaccharide; an ultraviolet absorber; an infrared absorber; an antioxidant; an ion exchange resin, and a metal oxide such as titanium oxide.

The ratio of each of such optional additives in the polymerizable composition is 0.1 parts by weight to 20 parts by weight relative to 100 parts by weight of the polymerizable compound.

The liquid crystal composition may be usually produced by mixing the components described above.

[5.2. Applying Step]

For forming the optically anisotropic layer, an applying step of applying the liquid crystal composition directly onto a surface of the first substrate to form the layer of the liquid crystal composition is performed. When the long-length first substrate is used in this step, the liquid crystal composition is applied onto one surface of the first substrate that is continuously conveyed. The conveyance direction of the first substrate may be usually the same as the applying direction of the liquid crystal composition.

Examples of the applying method may include a curtain coating method, an extrusion coating method, a roll coating method, a spin coating method, a dip coating method, a bar coating method, a spray coating method, a slide coating method, a printing coating method, a gravure coating method, a die coating method, a cap coating method, and a dipping method. For example, when a die coater is disposed in the die coating method so that a lip direction of the die coater is parallel to the widthwise direction of the first substrate, the applying direction of the liquid crystal composition is the same as the conveyance direction of the substrate (usually the lengthwise direction of the long-length first substrate). The thickness of layer of the liquid crystal composition to be applied may be appropriately set depending on a desired thickness required for the optically anisotropic layer.

[5.3. Orientation Step]

After the layer of the liquid crystal composition is formed, an orientation step of orienting the polymerizable liquid crystal compound in the layer of the liquid crystal composition is performed. In some cases, the orientation of the polymerizable liquid crystal compound may be immediately achieved by applying. In other cases, the orientation may be achieved by an orientation treatment such as heating after applying, if necessary. The conditions for the orientation treatment may be set depending on the properties of the liquid crystal composition to be used. For example, the conditions may be conditions of treatment at a temperature of 50° C. to 160° C. for 30 seconds to 5 minutes.

The polymerizable liquid crystal compound is oriented in a direction corresponding to the orientation regulating force of the first substrate. For example, when the first substrate has an orientation regulating force generated by stretching, the polymerizable liquid crystal compound contained in the layer of the liquid crystal composition can achieve orientation along a direction that is approximately the same as the slow axis direction of the first substrate by appropriately setting the composition of and the treatment conditions for the liquid crystal composition to be used. Accordingly, the applying direction of the liquid crystal composition to be used may be made different from the orientation direction of the polymerizable liquid crystal compound, if necessary. That is, the applying direction of the liquid crystal composition to be used and the orientation direction of the liquid crystal composition may be intersected with each other, if necessary.

[5.4. Drying Step]

In the method for forming the optically anisotropic layer, a step of polymerizing the polymerizable liquid crystal compound may be performed immediately after the step of orienting the polymerizable liquid crystal compound in the layer of the liquid crystal composition. If necessary, a step of drying the layer of the liquid crystal composition may be performed before the step of polymerizing the polymerizable liquid crystal compound. Such drying may be achieved by a drying method such as natural drying, heat drying, drying under reduced pressure, or heat drying under reduced pressure. By the drying, the solvent can be removed from the layer of the liquid crystal composition.

[5.5. Polymerization Step]

After the polymerizable liquid crystal compound is oriented, the step of polymerizing the polymerizable liquid crystal compound to obtain the optically anisotropic layer is performed. As the method for polymerizing the polymerizable liquid crystal compound, a method that is suitable for properties of the components of the liquid crystal composition, such as the polymerizable compound and the polymerization initiator, may be selected. Examples of the polymerization method may include an irradiation method with an active energy beam and a thermal polymerization method. Among these, the irradiation method with an active energy beam is preferable since the reaction may proceed at room temperature without heating. Examples of the active energy beam for irradiation herein may include light such as visible light, ultraviolet light, and infrared light, and any energy beam such as an electron beam. In particular, an irradiation method with light such as ultraviolet light is preferable because of simple operation.

The temperature during irradiation with ultraviolet light is preferably 30° C. or lower. The lower limit of the temperature during irradiation with ultraviolet light may be 15° C. or higher. The irradiation intensity of ultraviolet light generally falls within a range of 0.1 mW/cm$^2$ to 1,000 mW/cm$^2$, and preferably 0.5 mW/cm$^2$ to 600 mW/cm$^2$. The irradiation time of ultraviolet light falls within a range of 1 second to 300 seconds, and preferably 5 seconds to 100 seconds. The integrated illuminance of ultraviolet light (mJ/cm$^2$) is calculated by multiplying the irradiation intensity of ultraviolet light (mW/cm$^2$) by the irradiation time of ultraviolet light (second).

[6. Optional Layer]

The multilayer film of the present invention may further have an optional layer in combination with the first substrate and the optically anisotropic layer described above. For example, a protective film layer may be provided on the optically anisotropic layer on a side opposite to the first substrate.

[7. Method for Producing Multilayer Film]

The multilayer film of the present invention may be produced by a production method including steps of producing the first substrate and forming the optically anisotropic layer on the first substrate. The method for producing the first substrate and the method for forming the optically anisotropic layer are as described above.

Preferable examples of the method for producing the multilayer film may include a production method including steps of stretching the pre-stretch film formed of the crystallizable resin to obtain the stretched film (stretching step); relaxing the strain of the stretched film while maintaining the stretched film in a flat state, to obtain the first substrate (relaxation step); applying the liquid crystal composition directly onto the first substrate to form the layer of the liquid crystal composition (applying step); orienting the polymerizable liquid crystal compound in the layer of the liquid crystal composition (orientation step); and polymerizing the polymerizable liquid crystal compound to form the optically anisotropic layer (polymerization configuration).

According to the production method, the multilayer film having the first substrate formed of the crystallizable resin and the optically anisotropic layer formed directly on this first substrate can be produced. As to the multilayer film produced as described above, the optically anisotropic layer can be formed on the first substrate having a smooth surface and excellent size stability. Therefore, formation of a wrinkle on the surface of the optically anisotropic layer can be especially effectively suppressed.

[8. Optically Anisotropic Transfer Body]

The optically anisotropic transfer body may be produced using the multilayer film of the present invention. The optically anisotropic transfer body has the optically anisotropic layer and a second substrate. Such an optically anisotropic transfer body may be produced by a production method including a separation step of separating the optically anisotropic layer from the first substrate of the multilayer film and an attachment step of attaching the optically anisotropic layer to the second substrate. Either the separation step or the attachment step may be performed earlier. Alternatively, the both steps may be simultaneously performed.

Examples of the second substrate may include a film capable of protecting the optically anisotropic layer, such as a masking film. As the masking film, a known film (for example, FF1025 and "FF1035" available from Tredegar Corporation; "SAT116T", "SAT2038T-JSL", and "SAT4538T-JSL" available from Sun A. Kaken Co., Ltd.; "NBO-0424", "TFB-K001", "TFB-K0421", and "TFB-K202" available from Fujimori Kogyo Co., Ltd.; "DT-2200-25" and "K-6040" available from Hitachi Chemical Co., Ltd.; and "6010#75", "6010#100", "6011#75", or "6093#75" available from Teraoka Seisakusho Co., Ltd.) may be used. From the optically anisotropic transfer body having such a second substrate, the optically anisotropic layer can be easily transferred to another member. Therefore, when the optically anisotropic transfer body is used, an optical element having the optically anisotropic layer can be easily produced.

Another example of the second substrate is a substrate film having optical isotropy. Optical isotropy specifically represents that the in-plane retardation Re is preferably less than 10 nm, and more preferably less than 5 nm. In an optically isotropic substrate, the retardation Rth in a thickness direction is also preferably less than 10 nm, and more preferably less than 5 nm.

Examples of material for the optically isotropic substrate film may include a resin. Examples of the resin may include resins enumerated as the material for the first substrate. A film of such a resin as it is without stretching may be used as the second substrate. An optically anisotropic transfer body having the optically isotropic substrate film as the second substrate as it is may incorporated into an optical device such as a display device for use as an optical member.

The optically anisotropic transfer body may be a film having a long-length shape or a film having a sheet piece shape. In the production of an optically anisotropic transfer body having a long-length shape, a step of separating the optically anisotropic layer from the multilayer film and attaching the optically anisotropic layer to a long-length second substrate may be performed by a roll-to-roll operation. The optically anisotropic transfer body may be applied as an optical element, such as an optical compensation film and a polarization-converting element, to a liquid crystal display device provided with a liquid crystal panel capable of changing the orientation of liquid crystal by adjustment of voltage and polarizing plates disposed so as to interpose the liquid crystal panel therebetween. The liquid crystal panel is not particularly limited by its display mode. Examples of the display mode of the liquid crystal panel may include an in-plane switching (IPS) mode, a vertical alignment (VA) mode, a multi-domain vertical alignment (MVA) mode, a twisted nematic (TN) mode, a super twisted nematic (STN) mode, and an optical compensated bend (OCB) mode.

[9. Circularly Polarizing Plate]

When the optically anisotropic layer is used, a circularly polarizing plate may be produced. The circularly polarizing plate may be produced by a method including a step of attaching one or more layers of the optically anisotropic layer to a linear polarizer.

Specific embodiments of the circularly polarizing plate may include two embodiments described below.

Circularly polarizing plate (i): a circularly polarizing plate obtained by attaching the optically anisotropic layer to a linear polarizer, wherein the optically anisotropic layer is a layer separated from the multilayer film of the present invention.

Circularly polarizing plate (ii): a circularly polarizing plate obtained by attaching a ¼ wavelength plate, a ½ wavelength plate, and a linear polarizer, wherein the ¼ wavelength plate, the ½ wavelength plate, or both the plates are an optically anisotropic layer separated from the multilayer film of the present invention.

As the optically anisotropic layer provided in the circularly polarizing plate, an optically anisotropic layer separated from the multilayer film of the present invention as it is may be used. As the optically anisotropic layer provided in the circularly polarizing plate, an optically anisotropic transfer body obtained by separating the optically anisotropic layer from the multilayer film of the present invention and attaching the optically anisotropic layer to the second substrate as it is may be used. Alternatively, the optically anisotropic layer separated from the optically anisotropic transfer body again may also be used.

Either one of a step of separating the optically anisotropic layer from the multilayer film and a step of attaching the optically anisotropic layer to another layer (another optically anisotropic layer, linear polarizer, etc.) may be performed earlier. For example, a surface of the multilayer film on a side of the optically anisotropic layer may be attached to one surface of the linear polarizer, and then the step of separating the first substrate may be performed.

In the circularly polarizing plate (ii), a relationship of the slow axis of the ¼ wavelength plate, the slow axis of the ½ wavelength plate, and the transmission axis of the linear polarizer may be any of various known relationships. For example, when the optically anisotropic layer of the multilayer film of the present invention is used as both the ¼ wavelength plate and the ½ wavelength plate, the relationship may be a relationship in which the direction of slow axis of the ½ wavelength plate relative to the direction of transmission axis or absorption axis of the polarizer is 15° or an angle close to 15°, and the direction of slow axis of the ¼ wavelength plate relative to the direction of transmission axis or absorption axis of the polarizer is 75° or an angle close to 75°. Herein, 15° or an angle close to 15° may be, for example, 15°±5°, preferably 15°±° 4, and more preferably 15°±3°. Further, 75° or an angle close to 75° may be, for example, 75°±5°, preferably 75°±° 4, and more preferably 75°±3°. With such an embodiment, the circularly polarizing plate may be used as a broadband anti-reflective film for an organic EL display device.

In a product (multilayer film, circularly polarizing plate, display device, etc.), angular relashionship of directions of in-plane optical axes (slow axis, transmission axis, absorption axis, etc.) and a geometric direction (the lengthwise and widthwise directions of the film, etc.) is usually defined as a relationship where a shift in a certain direction is positive and a shift in another direction is negative. The positive and negative directions are commonly defined in components of the product. For example, in a circularly polarizing plate, "the direction of slow axis of the ½ wavelength plate relative to the direction of transmission axis or absorption axis of the linear polarizer is 15° and the direction of slow axis of the ¼ wavelength plate relative to the direction of transmission axis or absorption axis of the linear polarizer is 75°" represents the following two cases:

When the circularly polarizing plate is observed from one face thereof, the direction of slow axis of the ½ wavelength plate shifts clockwise by 15° from the direction of transmission axis or absorption axis of the linear polarizer and the direction of slow axis of the ¼ wavelength plate shifts clockwise by 75° from the direction of transmission axis or absorption axis of the linear polarizer.

When the circularly polarizing plate is observed from one face thereof, the direction of slow axis of the ½ wavelength plate shifts counterclockwise by 15° from the direction of transmission axis or absorption axis of the linear polarizer and the direction of slow axis of the ¼ wavelength plate shifts counterclockwise by 75° from the direction of transmission axis or absorption axis of the linear polarizer.

A specific embodiment of the circularly polarizing plate (i) may be an embodiment in which the circularly polarizing plate has one layer of ¼ wavelength plate as an optically anisotropic layer and the direction of slow axis of the ¼ wavelength plate relative to the transmission axis or absorption axis of the linear polarizer is 45° or an angle close to 45°. Herein, 45° or an angle close to 45° may be, for example, 45°±50, preferably 45°±4°, and more preferably 45°±3°. With such an embodiment, the circularly polarizing plate may be used as an anti-reflective film for an organic EL display device.

When the film such as the multilayer film, the optically anisotropic layer, and the linear polarizer is in a long-length shape, attachment may be performed by a roll-to-roll process. Attaching by a roll-to-roll process refers to an attachiment in which a step of sending a film from a roll of the long-length film, conveying the film, and attaching the film to another film on a conveyance line is performed, and the attached product is wound into a take-up roll. For example, when the linear polarizer and the multilayer film are attached, a step of sending the multilayer film from a roll of long-length multilayer film, conveying the film, and attaching the film to the linear polarizer on a conveyance line is performed. The attached product is wound into a take-up roll. Thus, attaching by a roll-to-roll process may be performed. In this case, the linear polarizer may also be sent from a roll and supplied to the attaching step.

As the linear polarizer, a known polarizer used for a device such as a liquid crystal display device and another optical device may be used. Examples of the linear polarizer may include a linear polarizer obtained by adsorbing iodine or a dichroic dye to a polyvinyl alcohol film and then uniaxially stretching the film in a boric acid bath; and a linear polarizer obtained by adsorbing iodine or a dichroic dye to a polyvinyl alcohol film, stretching the film, and further modifying a part of polyvinyl alcohol units in the molecular chain into a polyvinylene unit. Other examples of the linear polarizer may include a polarizer having a function of separating polarized light into reflective light and transmitted light, such as a grid polarizer, a multilayer polarizer, and a cholesteric liquid crystal polarizer. Among these, a polarizer containing polyvinyl alcohol is preferable.

When natural light is allowed to enter the polarizer, polarized light in only one direction is transmitted. The degree of polarization of the polarizer is not particularly limited, and is preferably 98% or more, and more preferably 99% or more. The average thickness of the polarizer is preferably 5 m to 80 µm.

One of applications of the circularly polarizing plate may be an application as anti-reflective film for a display device having an organic EL element. Specifically, when the circularly polarizing plate is provided on a surface of the display device so that a surface on a linear polarizer side is disposed so as to face a visual recognition side, radiation of light that enters from the outside of the display device and then reflects in the inside of the display device to the outside of the display device can be suppressed. As a result, an undesired phenomenon such as glare on a display surface of the display device can be suppressed. For example, among light that reaches the outside of the display device, only a part of linearly polarized light passes through the linear polarizer, which then passes through the optically anisotropic layer to be circularly polarized light. The circularly polarized light herein includes elliptically polarized light as long as an anti-reflection function is substantially expressed. The circularly polarized light is reflected on a component that reflects light in the display device (reflection electrode in the organic EL element, etc.), and then passes through the optically anisotropic layer again to be linearly polarized light having a polarization axis in a direction orthogonal to the polarization axis of the linearly polarized light that has entered. Thus, the linearly polarized light does not pass through the liner polarizer. Accordingly, the anti-reflection function is achieved. In particular, according to the circularly polarizing plate (ii) described above, the anti-reflection function at a broadband region can be achieved. The circularly polarizing plate having the aforementioned optically anisotropic layer has a reduced number of defects since formation of a wrinkle on the surface of the optically anisotropic layer is suppressed. Therefore, the anti-reflective effect can be especially favorably obtained. As to the relationship of three-dimensional refractive indexes (nx, ny, nz) of the optically anisotropic layer, those having a relationship of, for example, "nx>ny=nz", "nx>ny>nz", "nx>nz>ny", "nz>nx≥ny" may be used. When an optically anisotropic layer having a relationship of three-dimensional refractive index of "nx>nz>ny" is used, not only an anti-reflection function in a frontal direction but also an anti-reflection function in an oblique direction can be obtained.

If necessary, the circularly polarizing plate may be provided with an optional layer. Examples of the optional layer may include an adhesive layer for adhesion of members, a mat layer that makes the slidability of the film favorable, a hardcoat layer such as an impact resistant polymethacrylate resin layer, an anti-reflective layer, and an antifouling layer.

[10. Display Device]

The circularly polarizing plate may be used as a component of a display device such as a liquid crystal display device or an organic EL display device. In particular, it is preferable that the circularly polarizing plate is provided in the organic EL display device. Such an organic EL display device may be provided with the circularly polarizing plate as an anti-reflective film in a display device having an organic EL element as a display element, as described above.

In the display device, an optional member such as a prism array sheet, a lens array sheet, a light diffusing plate, and a brightness improving film may be provided in addition to the circularly polarizing plate.

[11. Optical Layered Body]

Using the optically anisotropic transfer body described above, an optical layered body may be obtained. The optical layered body is a member having the optically anisotropic transfer body and a third substrate. The optical layered body may be produced by a production method including a step of attaching the optically anisotropic transfer body and the third substrate. Usually in this production method, the surface of the optically anisotropic transfer body on the side of the optically anisotropic layer is attached to the third substrate. The optical layered body may be used as an optical element having various types of optical properties depending on the type of the third substrate.

The third substrate may be, for example, the linear polarizer described above. When the linear polarizer is used as the third substrate, a circularly polarizing plate having the second substrate, the optically anisotropic layer, and the linear polarizer may be obtained as the optical layered body.

For example, the third substrate may be an optical compensation layer. As the optical compensation layer, an appropriate type of layer suitable for the optical function required for the optical layered body may be adopted. In particular, it is preferable to use a layer capable of functioning as a positive C plate as the optical compensation layer. Therefore, it is preferable that refractive indexes nx, ny, and nz of the optical compensation layer satisfy nz>nx≥ny. As the layer capable of functioning as a positive C plate, for example, a stretched film described in Japanese Patent No. 2818983 B or Japanese Patent Application Laid-Open No. Hei. 6-88909 A; a film containing a copolymer of poly(N-vinyl carbazole) and polystyrene described in Japanese Patent Application Laid-Open No. 2010-126583 A; or a homeotropically orienting liquid crystal film described in Japanese Patent No. 3842102 B may be used.

In particular, it is preferable that refractive indexes nx and ny of the optical compensation layer are the same or close to each other. Specifically, the difference nx−ny between the refractive indexes nx and ny is preferably 0.00000 to 0.00100, more preferably 0.00000 to 0.00050, and particularly preferably 0.00000 to 0.00020. When the refractive index difference nx−ny falls within the aforementioned range, adjustment of attachment direction during attachment of the optically anisotropic transfer body and the optical compensation layer as the third substrate can be eliminated.

The in-plane retardation Re of the optical compensation layer at a measurement wavelength of 590 nm is preferably 0 nm to 10 nm, more preferably 0 nm to 5 nm, and particularly preferably 0 nm to 2 nm. When the in-plane retardation Re of the optical compensation layer falls within the aforementioned range, adjustment of attachment direction during attachment of the optically anisotropic transfer body and the optical compensation layer as the third substrate can be eliminated.

The retardation Rth in the thickness direction of the optical compensation layer at a measurement wavelength of 590 nm is preferably −200 nm or more, more preferably −130 nm or more, and particularly preferably −100 nm or more, and is preferably −10 nm or less, more preferably −30 nm or less, and particularly preferably −50 nm or less. When the retardation Rth in the thickness direction of the optical compensation layer falls within the aforementioned range, the optically anisotropic layer can exert a suitable optical compensation function.

As the aforementioned optical compensation layer, for example, a resin film layer, a layer of the liquid crystal composition, a layer obtained by curing the liquid crystal composition, or the like may be used.

The thickness of the optical compensation layer is preferably 1.0 μm or more, and more preferably 3.0 μm or more, and is preferably 50 μm or less, more preferably 40 μm or less, and particularly preferably 30 μm or less.

The optical layered body may further have an optional layer in combination with the optically anisotropic transfer body and the third substrate. Examples of the optional layer may include an adhesive layer for attaching the optically anisotropic transfer body and the third substrate.

[12. Optically Anisotropic Member]

The aforementioned optically anisotropic layer is obtained by separating the second substrate from the optically anisotropic transfer body. Using this optically anisotropic layer, an optically anisotropic member may be obtained.

The optically anisotropic member is a member having the optically anisotropic layer obtained by separating the second substrate from the optically anisotropic transfer body, and the third substrate. The optically anisotropic member may be produced by a production method including steps of separating the optically anisotropic layer from the optically anisotropic transfer body and attaching the optically anisotropic layer and the third substrate. In this production method, the step of attaching the optically anisotropic layer and the third substrate is usually performed after the step of separating the optically anisotropic layer from the optically anisotropic transfer body. The optically anisotropic member may be produced by a production method including a step of separating the second substrate from the optical layered body.

The optically anisotropic member may be used as an optical element having various types of optical properties depending on the type of the third substrate.

The third substrate may be, for example, the linear polarizer described above. When the linear polarizer is used as the third substrate, a circularly polarizing plate having the optically anisotropic layer and the linear polarizer can be obtained as the optically anisotropic member.

For example, the third substrate may be the optical compensation layer described above. As the optical compensation layer, the same layer as enumerated in the section of optical layered body may be used.

The optically anisotropic member may further have an optional layer in combination with the optically anisotropic layer and the third substrate. Examples of the optional layer may include an adhesive layer for attaching the optically anisotropic layer and the third substrate.

EXAMPLES

The present invention will be specifically described referring to Examples. However, the present invention is not limited to the following Examples, and may be implemented with any modification without departing from the scope of claims and equivalents thereto.

Unless otherwise specified, "%" and "parts" referring to amount in the following description is on the basis of weight. Unless otherwise specified, the operations in the following were performed in an atmospheric environment at an ordinary temperature and ordinary pressure.

[Evaluation Method]
[Method for Measuring Weight-Average Molecular Weight and Number-Average Molecular Weight]

The weight-average molecular weight and number-average molecular weight of a polymer were measured as polystyrene equivalent values using a gel permeation chromatography (GPC) system ("HLC-8320" manufactured by Tosoh Corporation) In the measurement, an H-type column (manufactured by Tosoh Corporation) was used as a column, and tetrahydrofuran was used as a solvent. The temperature during the measurement was 40° C.

[Method for Measuring Glass Transition Temperature Tg and Melting Point Tm]

A sample heated to 300° C. under a nitrogen atmosphere was quenched with liquid nitrogen, and heated at 10° C./min using a difference scanning calorimeter (DSC), and thus, the glass transition temperature Tg and melting point Tm of the sample were each determined.

[Method for Measuring Hydrogenation Ratio of Polymer]

The hydrogenation ratio of the polymer was measured by 1H-NMR measurement at 145° C. using o-dichlorobenzene-$d^4$ as a solvent.

[Method for Measuring Ratio of Racemo Diad of Polymer]

The polymer was subjected to $^{13}$C-NMR measurement at 200° C. by an inverse-gated decoupling method using o-dichlorobenzene-$d^4$ as a solvent. From the result of the $^{13}$C-NMR measurement, the ratio of racemo diad of the polymer was determined on the basis of intensity ratios of a signal at 43.35 ppm attributed to a meso diad and a signal at 43.43 ppm attributed to a racemo diad relative to a peak at 127.5 ppm of o-dichlorobenzene-$d^4$ as a reference shift.

[Method for Measuring Orientation Angle of Film]

In-plane slow axes were observed at a plurality of points disposed at intervals of 50 mm in the widthwise direction of the film using a polarized light microscope (polarized light microscope "BX51" manufactured by Olympus Corporation), and angles formed between the slow axes and the widthwise direction of the film (orientation angles) were measured. The average of the orientation angles at the measured points was adopted as an orientation angle of the film (i.e., the direction of the slow axis relative to the widthwise direction).

[Method for Measuring In-Plane Retardation of Film]

In-plane retardations were measured at a plurality of points disposed at intervals of 50 mm in the widthwise direction of the film using a phase difference meter ("KOBRA-21ADH" manufactured by Oji Scientific Instruments Co., Ltd.). The average of the in-plane retardations at the measured points was adopted as an in-plane retardation of the film. At that time, the measurement wavelength was 590 nm.

[Method for Measuring Haze of Film]

The film was cut out at a randomly selected portion, to obtain a thin-layer sample having a square shape of 50 mm×50 mm. Subsequently, the haze of the thin-layer sample was measured using a haze meter ("NDH5000" manufactured by Nippon Denshoku Industries Co., Ltd.).

[Method for Measuring Tensile Elastic Modulus of Film]

The film was cut out to obtain a first test piece in a rectangular shape having long sides parallel to the lengthwise direction of the film (10 mm in width×250 mm in length), and a second test piece in a rectangular shape having long sides parallel to the widthwise direction of the film (250 mm in length×10 mm in width). The stress at which each of the first and second test pieces was distorted by drawing in the long side direction was measured in accordance with JIS K7113 using a tensile tester provided with a constant temperature and humidity chamber (5564 series digital material testing system manufactured by Instron Japan Co., Ltd.) under conditions of a temperature of 23° C., a humidity of 60±5% RH, a distance between chucks of 115 mm, and a tensile speed of 100 mm/min. For each of the first and second test pieces, the measurement was repeated three times. From the measurement data of the measured stress and distortion corresponding to the stress, measurement data in which the distortion of each of the test pieces fallen within a range of 0.6% to 1.2% for every 0.2% were selected. That is, the measurement data in which the distortion of each of the test pieces was 0.6%, 0.8%, 1.0%, and 1.2% were selected. From the measurement data selected for the three measurements, the tensile elastic modulus of each of the films was calculated using a least-square method.

[Method for Measuring Thermal Size Change Rate of Substrate Film]

A substrate film was cut out in an environment at a room temperature of 23° C., to obtain a thin film sample having a square shape of 150 mm×150 mm, which was used as a sample film. This sample film was heated in an oven of 150° C. for 60 minutes, and cooled to 23° C. (room temperature) The lengths of four sides and two diagonal corner-to-corner lines of the sample film were measured. The thermal size change rate based on the measured length of each of four sides was calculated by the following equation (a). In the equation (a), $L_A$ is the length of each side of the heated sample (sample film).

$$\text{Thermal size change rate (\%)}=[(L_A-150)/150]\times 100 \tag{a}$$

The thermal size change rate based on the measured length of each of two diagonal corner-to-corner lines was calculated by the following equation (b). In the equation (b), $L_D$ is the length of each diagonal corner-to-corner line of the heated sample.

$$\text{Thermal size change rate (\%)}=[(L_D-212.13)/212.13]\times 100 \tag{b}$$

The value whose absolute value was the maximum among six calculated values of thermal size change rate was adopted as the thermal size change rate (%) of the substrate film.

[Method for Measuring Shift Angle Between Slow Axis of Substrate Film and Slow Axis of Optically Anisotropic Layer]

Before a liquid crystal composition was applied onto a substrate film, a reference line was drawn on a surface of the substrate film on a side opposite to a surface onto which the liquid crystal composition was to be applied. After an optically anisotropic layer was formed, another reference line was drawn on a surface of the optically anisotropic layer at a position superposed on the reference line of the substrate film. After that, the optically anisotropic layer of the multilayer film was attached to a glass plate through an adhesive, and separated from the substrate film. The slow axis of the substrate film and the slow axis of the optically anisotropic layer were each measured using a polarimeter ("AxoScan" manufactured by Axometrics, Inc.). The angle formed between the slow axis of the substrate film and the reference line drawn on the substrate film and the angle formed between the slow axis of the optically anisotropic layer and the reference line drawn on the optically anisotropic layer were measured. From the measured angles, the shift angle between the slow axis of the substrate film and the slow axis of the optically anisotropic layer was calculated.

[Method for Evaluating Degree of Orientation of Optically Anisotropic Layer]

The optically anisotropic layer of the multilayer film was attached to a glass plate, and the substrate film was separated to prepare a sample. This sample was disposed between two linear polarizers (polarizer and analyzer). At that time, directions of the linear polarizers were disposed so that polarized light transmission axes of the polarizers were perpendicular to each other as viewed in a thickness direction. The slow axis direction of the optically anisotropic layer was set to be parallel or perpendicular to the polarized light transmission axes of the linear polarizers as viewed in the thickness direction. Keeping this state, the transmittance of light passing through the sample (transmittance under crossed nicols) was measured using a spectrophotometer ("V7200" manufactured by JASCO Corporation) and an automated polarizing film measurement device ("VAP-7070S" manufactured by JASCO Corporation). On the basis of the measured transmittance, the degree of orientation of the optically anisotropic layer was evaluated in accordance with the following criteria. Herein, a "bottom wavelength" means a wavelength in which the transmittance under crossed nicols is the smallest among wavelengths in a visible region.

"Excellent": the transmittance under crossed nicols at the bottom wavelength was 0.010% or less.

"Good": the transmittance under crossed nicols at the bottom wavelength was more than 0.010% and 0.020% or less.

"Acceptable": the transmittance under crossed nicols at the bottom wavelength was more than 0.020% and 0.030% or less.

"Out of use": the transmittance under crossed nicols at the bottom wavelength was more than 0.030%.

[Method for Evaluating Wrinkle on Surface]

The multilayer film was cut out to obtain a sample having a shape of 10 cm×10 cm. This sample was disposed between a polarizer and an analyzer, and observed while the analyzer was rotated. The state of a wrinkle on a surface of the optically anisotropic layer was evaluated in accordance with the following criteria.

"Excellent": unevenness caused by a wrinkle was not recognized.

"Good": unevenness caused by a wrinkle was recognized only in a small region.

"Poor": unevenness caused by a wrinkle was partially recognized.

"Out of use": unevenness caused by a wrinkle was remarkable, and the unevenness was also recognized in the appearance.

Preparative Example 1

Production of Substrate Film A (Step of Producing Hydrogenated Product of Ring-Opening Polymer of Dicyclopentadiene)

A metal pressure-resistant reaction vessel was sufficiently dried and the inside thereof was replaced with nitrogen. In the metal pressure-resistant reaction vessel, 154.5 parts of cyclohexane, 42.8 parts of a solution of dicyclopentadiene with a concentration of 70% (endo-stereoisomer content: 99% or more) in cyclohexane (amount of dicyclopentadiene: 30 parts), and 1.9 parts of 1-hexene were placed, and warmed to 53° C.

0.061 parts of a solution of diethylaluminum ethoxide with a concentration of 19% in n-hexane was added to a solution prepared by dissolving 0.014 parts of tetrachlorotungsten phenylimide(tetrahydrofuran) complex in 0.70 parts of toluene, and the mixture was stirred for 10 minutes to prepare a catalyst solution.

The catalyst solution was added to the pressure-resistant reaction vessel to initiate a ring-opening polymerization reaction. After that, the reaction was performed for 4 hours while the temperature was kept at 53° C., to obtain a solution of ring-opening polymer of dicyclopentadiene.

The number-average molecular weight (Mn) and weight-average molecular weight (Mw) of the obtained ring-opening polymer of dicyclopentadiene were 8,750 and 28,100, respectively, and the molecular weight distribution (Mw/Mn) calculated therefrom was 3.21.

To 200 parts of the obtained solution of the ring-opening polymer of dicyclopentadiene, 0.037 parts of 1,2-ethanediol as a terminator was added. The mixture was warmed to 60° C. and stirred for 1 hour, to stop the polymerization reaction. To the mixture, 1 part of a hydrotalcite-like compound ("KYOWAAD (registered trademark) 2000" available from Kyowa Chemical Industry Co., Ltd.) was added. The mixture was warmed to 60° C. and stirred for 1 hour. After that, 0.4 parts of a filtration aid ("RADIOLITE (registered trademark) #1500" available from Showa Chemical Industry Co., Ltd.) was added, and the mixture was filtered through a PP pleated cartridge filter ("TCP-HX" available from Advantec Toyo Kaisha, Ltd.) and separated into an adsorbent and the solution.

To 200 parts of the filtered solution of the ring-opening polymer of dicyclopentadiene (amount of the polymer: 30 parts), 100 parts of cyclohexane was added. 0.0043 parts of chlorohydridecarbonyl tris(triphenylphosphine)ruthenium was then added, and a hydrogenation reaction was performed at a hydrogen pressure of 6 MPa and 180° C. for 4 hours. As a result, a reaction liquid containing a hydrogenated product of the ring-opening polymer of dicyclopentadiene was obtained. This reaction liquid was a slurry solution in which the hydrogenated product was deposited.

The hydrogenated product contained in the aforementioned reaction liquid was separated from the solution using a centrifugal separator, and dried under reduced pressure at 60° C. for 24 hours, to obtain 28.5 parts of the hydrogenated product of the ring-opening polymer of dicyclopentadiene having crystallizability. The hydrogenation ratio of the hydrogenated product was 99% or more, the glass transition temperature Tg was 93° C., the melting point (Tm) was 262° C., and the ratio of a racemo diad was 89%.

(Step of Producing Pre-Stretch Film)

100 parts of the hydrogenated product of the ring-opening polymer of dicyclopentadiene thus obtained was mixed with 1.1 parts of an antioxidant (tetrakis[methylene-3-(3',5'-di-t-butyl-4'-hydroxyphenyl)propionate]methane; "Irganox (registered trademark) 1010" available from BASF Japan Ltd.), to obtain a crystallizable resin as a material for a film.

The aforementioned crystallizable resin was put into a twin-screw extruder ("TEM-37B" manufactured by Toshiba Machine Co., Ltd.) equipped with four die holes with an inner diameter of 3 mm. The crystallizable resin was molded by thermal melt extrusion molding using the twin-screw extruder, to obtain a molded body having a strand shape. The molded body was finely cut by a strand cutter, to obtain pellets of the crystallizable resin. The operation conditions of the twin-screw extruder are as follows.

Barrel set temperature: 270° C. to 280° C.
Die set temperature: 250° C.
Screw rotation speed: 145 rpm
Feeder rotation speed: 50 rpm Subsequently, the obtained pellets were supplied to a thermal melt extrusion film molding device equipped with a T-die. A long-length pre-stretch film (thickness: 50 μm, width: 860 mm) formed of the aforementioned crystallizable resin was produced using this film molding device at a speed of 26.45 m/min by a method of winding the film into a roll. The operation conditions of the film molding device are as follows.

Barrel set temperature: 280° C. to 290° C.
Die temperature: 270° C.
Screw rotation speed: 30 rpm The haze of the obtained pre-stretch film was measured and found to be 0.3%.

(Stretching Step)

A tenter stretching machine equipped with clips capable of gripping two sides at ends in the widthwise direction of the long-length pre-stretch film was prepared. The long-length pre-stretch film was supplied to the tenter stretching machine, and uniaxially stretched at a stretching ratio of 2.41 times in the widthwise direction of the long-length pre-stretch film while the two sides at the ends in the widthwise direction of the pre-stretch film were gripped by the clips. Thus, a stretched film was obtained. The operation conditions of the tenter stretching machine are as follows.

Stretching speed: 5,000 mm/min
Stretching temperature: 110° C.

(Crystallization Promoting Step)

Two sides at the ends in the widthwise direction of the stretched film were held by the clips of the tenter stretching machine, to keep the stretched film in a strained state. The stretched film was heated in an oven at 200° C. for 30 seconds, to perform a crystallization promoting step of promoting crystallization of the hydrogenated product of the ring-opening polymer of dicyclopentadiene contained in the stretched film. Thus, a substrate film A was obtained. The thickness of the substrate film A was 20 μm, the orientation angle was 0°, the in-plane retardation Re was 270 nm, and the tensile elastic modulus at 23° C. was 2,587 MPa in the lengthwise direction and 2,518 MPa in the widthwise direction. The haze of the substrate film A was measured and found to be 0.4%. The thermal size change rate of the substrate film A at a temperature of 150° C. was measured by the aforementioned method, and found to be 1.5%. The water absorption of the substrate film A was found to be 0.009%.

Preparative Example 2

Production of Substrate Film B

Two sides at the ends in the widthwise direction of the substrate film A produced in Preparative Example 1 were gripped by the clips of the tenter stretching machine, to set the substrate film A to the tenter stretching machine. The substrate film A was subjected to a relaxation step of relaxing the strain of the substrate film A while maintaining the substrate film A in a flat state at a temperature of 200° C., to obtain a substrate film B. In this relaxation step, the distance between the clips of the tenter stretching machine were decreased by shifting the clips in an in-plane direction of the substrate film A, to thereby achieve relaxation of the strain of the substrate film A. The distance between the clips was decreased by 1.0% in the widthwise direction of the substrate film A over 30 seconds. The thickness of the substrate film B was 18 μm, the orientation angle was 0°, the in-plane retardation Re was 268 nm, and the tensile elastic modulus at 23° C. was 3,311 MPa in the lengthwise direction and 3,119 MPa in the widthwise direction. The haze of the substrate film B was measured and found to be 0.4%. The thermal size change rate of the substrate film B at a temperature of 150° C. was measured by the aforementioned method, and found to be 0.5%. The water absorption of the substrate film B was found to be 0.009%.

Preparative Example 3

Production of Substrate Film C

Pellets of a thermoplastic norbornene resin (available from ZEON Corporation, glass transition temperature: 126° C.) were dried at 100° C. for 5 hours. The dried pellets were supplied to an extruder, and melted in the extruder. The melted resin was passed through a polymer pipe and a polymer filter, extruded from a T-die on a casting drum in a sheet shape, and cooled, to obtain a pre-stretch film having a thickness of 60 μm and a width of 1,350 mm. This pre-stretch film was wound while the pre-stretch film was attached to a masking film (FF1025 available from Tredegar Corporation) for protection. Thus, a film roll was obtained.

The pre-stretch film was drawn from the film roll, and the masking film was separated. After that, the pre-stretch film was uniaxially stretched in an oblique direction at a stretching ratio of 1.5 times and a stretching temperature of 142° C., to obtain a substrate film C as a stretched film. The thickness of the substrate film C was 35 μm, the orientation angle was 15°, the in-plane retardation Re was 141 nm, and the tensile elastic modulus at 23° C. was 2,402 MPa in the lengthwise direction and 2,390 MPa in the widthwise direction. The haze of the substrate film C was measured and found to be 0.1%. Further measurement of the thermal size change rate of the substrate film C at a temperature of 150° C. by the aforementioned method was attempted. However, the measurement was unsuccessful due to occurrence of a wrinkle on the overall surface. The water absorption of the substrate film C was found to be 0.009%.

Preparative Example 4

Production of Liquid Crystal Composition I 24.15 parts of a polymerizable liquid crystal compound ("LC242" available from BASF, a compound represented by the following formula (A1)), 0.12 parts of a surfactant ("FTERGENT FTX-209F" available from Neos Company Limited), 0.73 parts of a polymerization initiator ("IRGACURE379" available from BASF), and 75.00 parts of a solvent (methyl ethyl ketone) were mixed to obtain a liquid crystal composition I.

Example 1

As a first substrate, the substrate film A produced in Preparative Example 1 was prepared. The liquid crystal composition I produced in Preparative Example 4 was applied directly onto this substrate film A by a die coater at a room temperature of 25° C., to form a layer of the liquid crystal composition. The lip direction of the die coater was set to be parallel to the widthwise direction of the substrate film A. Thus, the applying of the liquid crystal composition I was performed so that the applying direction was parallel to the lengthwise direction of the substrate film A. The layer of the liquid crystal composition was heated at an orientation temperature of 110° C. for 2.5 minutes. As a result, the polymerizable liquid crystal compound in the layer of the liquid crystal composition was oriented. After that, the layer of the liquid crystal composition was irradiated with ultraviolet light of 100 mJ/cm$^2$ or more under a nitrogen atmosphere, to polymerize the polymerizable liquid crystal compound. Thus, an optically anisotropic layer that had a dry thickness of 1.1 μm and was homogeneously oriented was formed. As a result, a multilayer film having the substrate film A and the optically anisotropic layer formed directly on the substrate film A was obtained. For the obtained multilayer film, the shift angle between the slow axis of the substrate film and the slow axis of the optically anisotropic layer, the degree of orientation of the optically anisotropic layer, and a wrinkle on a surface were evaluated by the methods described above.

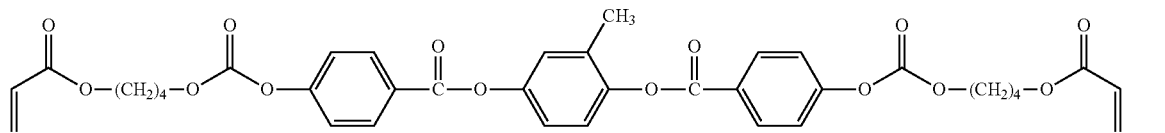

(A1)

Preparative Example 5

Production of Liquid Crystal Composition II 21.25 parts of a polymerizable liquid crystal compound having inverse wavelength dispersion represented by the formula (BI), 0.11 parts of a surfactant ("Surflon S420" available from AGC Seimi Chemical Co., Ltd.), 0.64 parts of a polymerization initiator ("IRGACURE379" available from BASF), and 78.00 parts of a solvent (cyclopentanone available from ZEON Corporation) were mixed to obtain a liquid crystal composition II.

Example 2

The substrate film B was used in place of the substrate film A. The application amount of the liquid crystal composition I was changed such that the dry thickness of the optically anisotropic layer was 2.2 μm. Except for the aforementioned changes, a multilayer film was produced and evaluated in the same manner as in Example 1.

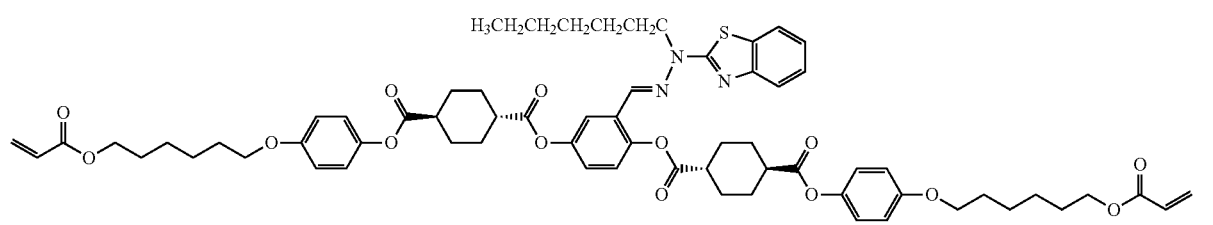

(B1)

Example 3

The liquid crystal composition II was used in place of the liquid crystal composition I. The orientation temperature was changed from 110° C. to 115° C. Except for the aforementioned changes, a multilayer film was produced and evaluated in the same manner as in Example 1.

Example 4

The substrate film B was used in place of the substrate film A. The liquid crystal composition II was used in place of the liquid crystal composition I. The orientation temperature was changed from 110° C. to 115° C. Except for the aforementioned changes, a multilayer film was produced and evaluated in the same manner as in Example 1.

Comparative Example 1

The pre-stretch film produced in Preparative Example 1 was used in place of the substrate film A. Except for the aforementioned change, a multilayer film was produced and evaluated in the same manner as in Example 1. However, the polymerizable liquid crystal compound was unable to be oriented in the layer of the liquid crystal composition, and an optically isotropic layer was therefore formed in place of the optically anisotropic layer.

Comparative Example 2

The substrate film C was used in place of the substrate film A. Except for the aforementioned change, a multilayer film was produced and evaluated in the same manner as in Example 1.

[Results]

The results in Examples and Comparative Examples are shown in the following Table 1. Abbreviations in Table 1 mean as follows.

POLY-D: crystallizable resin

COP: thermoplastic norbornene resin

Orientation angle: orientation angle of substrate film

Re: in-plane retardation

Δn: birefringence

Tensile elastic modulus MD: tensile elastic modulus in lengthwise direction of substrate film Tensile elastic modulus TD: tensile elastic modulus in widthwise direction of substrate film

TABLE 1

[Results of Examples and Comparative Examples]

|  | Ex. 1 | Ex. 2 | Ex. 3 | Ex. 4 | Comp. Ex. 1 | Comp. Ex. 2 |
|---|---|---|---|---|---|---|
| Substrate film | | | | | | |
| Resin | POLY-D | POLY-D | POLY-D | POLY-D | POLY-D | COP |
| Film ID | A | B | A | B | Pre-stretch | C |
| Stretching step | Transversal stretching | Transversal stretching | Transversal stretching | Transversal stretching | Not strethced | Oblique |
| Stretching temperature (° C.) | 110 | 110 | 110 | 110 | — | 142 |
| Relaxation Step | No | Yes | No | Yes | No | No |
| Relaxation temperature (° C.) | — | 200 | — | 200 | — | — |
| Orientation angle | 0° | 0° | 0° | 0° | Not oriented | 15° |
| Re (nm) | 270 | 268 | 270 | 268 | — | 141 |
| Thickness (μm) | 20 | 18 | 20 | 18 | 50 | 35 |
| Δn | 0.0135 | 0.0149 | 0.0135 | 0.0149 | — | 0.0040 |
| Tensile elastic modulus MD (MPa) | 2587 | 3311 | 2587 | 3311 | 2117 | 2402 |
| Tensile elastic modulus TD (MPa) | 2518 | 3119 | 2518 | 3119 | 2096 | 2390 |
| Rubbing treatment | No | No | No | No | No | No |
| Optically anisotropic layer | | | | | | |
| Liquid crystal composition | I | I | II | II | I | I |
| Applying direction | Lengthwise direction | Lengthwise direction | Lengthwise direction | Lengthwise direction | Lengthwise direction | Lengthwise direction |
| Orientation temperature (° C.) | 110 | 110 | 115 | 115 | 110 | 110 |
| Re (nm) | 145 | 270 | 144 | 145 | — | 145 |
| Thickness (μm) | 1.1 | 2.2 | 1.1 | 1.1 | 1.1 | 1.1 |
| Shift angle (°) | 1.1 | 0.8 | 0.8 | 0.7 | — | 0.8 |
| Degree of orientation | Good | Good | Good | Good | Out of use | Good |
| Wrinkle on Surface | Excellent | Excellent | Excellent | Excellent | Good | Poor |

[Discussion]

As seen from Table 1, in Examples, the cured liquid crystal molecules contained in the optically anisotropic layer are oriented by the orientation regulating force of the substrate film as the stretched film formed of the crystallizable resin. As a result, high degree of orientation is achieved. Further, in Examples, formation of wrinkles on a surface of the optically anisotropic layer is suppressed by high tensile elastic modulus of the substrate film that is equal to or more than the predetermined value. Accordingly, as confirmed from Examples, the present invention can achieve a multilayer film having an optically anisotropic layer in which a wrinkle on a surface is suppressed.

The invention claimed is:

1. A multilayer film comprising a first substrate and an optically anisotropic layer that is formed directly on the first substrate and contains cured liquid crystal molecules, wherein
the first substrate is formed of a resin containing a crystallizable alicyclic structure-containing polymer,
the first substrate has an orientation regulating force, and
the first substrate has a tensile elastic modulus at 23° C. of 2,500 MPa or more.

2. The multilayer film according to claim 1, wherein the orientation regulating force of the first substrate is generated by stretching.

3. The multilayer film according to claim 1, wherein
the first substrate has a slow axis, and
the optically anisotropic layer has a slow axis approximately parallel to a direction of the slow axis of the first substrate.

4. The multilayer film according to claim 1, wherein the first substrate is formed of a resin having a positive intrinsic birefringence.

5. The multilayer film according to claim 1, wherein the first substrate has a birefringence Δn of 0.0010 or more.

6. The multilayer film according to claim 1, wherein the alicyclic structure-containing polymer is a hydrogenated product of a ring-opening polymer of dicyclopentadiene.

7. The multilayer film according to claim 1, wherein the optically anisotropic layer has a thickness of 5 μm or less.

8. A method for producing an optically anisotropic transfer body comprising the steps of:
separating the optically anisotropic layer from the first substrate of the multilayer film according to claim 1; and
attaching the optically anisotropic layer to a second substrate.

9. A method for producing the multilayer film according to claim 1, comprising the steps of:
stretching a pre-stretch film formed of a resin containing a crystallizable alicyclic structure-containing polymer at a temperature that is equal to or higher than the glass transition temperature of the polymer Tg−30° C. and equal to or lower than Tg+60° C. to obtain a stretched film;
relaxing strain of the stretched film at a temperature that is equal to or higher than the glass transition temperature of the polymer and equal to or lower than the melting point of the polymer while maintaining the stretched film in a flat state, to obtain a first substrate;
applying a liquid crystal composition containing a polymerizable liquid crystal compound directly onto the first substrate, to form a layer of the liquid crystal composition;
orienting the polymerizable liquid crystal compound in the layer of the liquid crystal composition; and
polymerizing the polymerizable liquid crystal compound to obtain an optically anisotropic layer.

10. An optically anisotropic layer obtained by separating the second substrate from the optically anisotropic transfer body produced by the method for producing an optically anisotropic transfer body according to claim 8.

11. An optically anisotropic member comprising the optically anisotropic layer according to claim 10 and a third substrate.

12. The optically anisotropic member according to claim 11, wherein the third substrate is a linear polarizer.

13. The optically anisotropic member according to claim 11, wherein the third substrate is an optical compensation layer.

14. An optical layered body comprising the optically anisotropic transfer body produced by the method for producing an optically anisotropic transfer body according to claim 8 and a third substrate.

15. The optical layered body according to claim 14, wherein the third substrate is a linear polarizer.

16. The optical layered body according to claim 14, wherein the third substrate is an optical compensation layer.

17. An optically anisotropic member obtained by separating the second substrate from the optical layered body according to claim 14.

* * * * *